(12) United States Patent
 Kiguchi et al.

(10) Patent No.: US 12,336,094 B2
(45) Date of Patent: Jun. 17, 2025

(54) WIRING BOARD AND POWER CONVERSION APPARATUS

(71) Applicant: FUJI ELECTRIC CO., LTD., Kanagawa (JP)

(72) Inventors: Ryoga Kiguchi, Tokyo (JP); Hiromu Takubo, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 298 days.

(21) Appl. No.: 18/057,950

(22) Filed: Nov. 22, 2022

(65) Prior Publication Data

US 2023/0079140 A1   Mar. 16, 2023

(30) Foreign Application Priority Data

Jan. 31, 2022   (JP) ................ 2022-013750

(51) Int. Cl.
  *H05K 1/02* (2006.01)
  *H05K 1/16* (2006.01)

(52) U.S. Cl.
  CPC ........... *H05K 1/0298* (2013.01); *H05K 1/165* (2013.01); *H05K 1/167* (2013.01); *H05K 2201/086* (2013.01); *H05K 2201/09227* (2013.01); *H05K 2201/09236* (2013.01); *H05K 2201/10166* (2013.01); *H05K 2201/10886* (2013.01)

(58) Field of Classification Search
  CPC ....... H05K 1/0298; H05K 2201/09227; H05K 2201/09236; H05K 2201/10166; H05K 2201/10886; H02M 7/003; H01L 25/072
  See application file for complete search history.

(56) References Cited

U.S. PATENT DOCUMENTS 8,154,874 B2 *   4/2012   Zhuang ............... H01L 23/5387
                                                                361/728
2021/0143136 A1   5/2021   Usui

FOREIGN PATENT DOCUMENTS

| EP | 2928057 | 10/2015 |
|---|---|---|
| JP | H06-132288 | 5/1994 |
| JP | 2000-060126 | 2/2000 |
| JP | 2005-176555 | 6/2005 |
| JP | 2014-230184 | 12/2014 |
| JP | 2015-198545 | 11/2015 |
| JP | 2018-014792 | 1/2018 |
| JP | 2020-021550 | 2/2020 |
| WO | 2019/016929 | 1/2019 |

* cited by examiner

*Primary Examiner* — James Wu
(74) *Attorney, Agent, or Firm* — IPUSA, PLLC

(57) ABSTRACT

A wiring board includes a pair of hard substrates provided for each of a plurality of semiconductor elements connected in parallel; a soft substrate provided so as to be at least partially sandwiched between all of the pairs of hard substrates; a first electrode configured to connect a control terminal of the semiconductor element and the hard substrate or the soft substrate; a second electrode configured to connect a reference potential terminal of the semiconductor element and the hard substrate or the soft substrate; a first wiring configured to connect in parallel the first electrodes of each of the plurality of semiconductor elements, at least part of the first wiring being provided on the soft substrate; and a second wiring configured to connect in parallel the second electrodes of each of the plurality of semiconductor elements, at least part of the second wiring being provided on the soft substrate.

15 Claims, 19 Drawing Sheets

WIRING BOARD AND POWER
CONVERSION APPARATUS

CROSS-REFERENCE TO RELATED
APPLICATION

The present application is based upon and claims priority to Japanese Patent Application No. 2022-013750, filed on Jan. 31, 2022, the entire contents of which are incorporated herein by reference.

BACKGROUND OF THE INVENTION

1. Field of the Invention

The present disclosure relates to a wiring board, etc.

2. Description of the Related Art

For example, a wiring board for driving multiple semiconductor elements that are connected in parallel, by a single driving circuit, is known (see Patent Document 1).

RELATED-ART DOCUMENTS

Patent Document

[Patent Document 1] Japanese Laid-Open Patent Application Publication No. 2018-14792

SUMMARY OF THE INVENTION

According to one aspect of an embodiment, a wiring board includes a pair of hard substrates provided for each of a plurality of semiconductor elements connected in parallel; a soft substrate provided so as to be at least partially sandwiched between all of the pairs of hard substrates; a first electrode configured to connect a control terminal of the semiconductor element and the hard substrate or the soft substrate; a second electrode configured to connect a reference potential terminal of the semiconductor element and the hard substrate or the soft substrate; a first wiring configured to connect in parallel the first electrodes of each of the plurality of semiconductor elements, at least part of the first wiring being provided on the soft substrate; and a second wiring configured to connect in parallel the second electrodes of each of the plurality of semiconductor elements, at least part of the second wiring being provided on the soft substrate.

According to another aspect of an embodiment, a wiring board includes a hard substrate provided for each of a plurality of semiconductor elements connected in parallel; a soft substrate configured to connect the hard substrates to each other; a first electrode configured to connect a control terminal of the semiconductor element and the hard substrate; a second electrode configured to connect a reference potential terminal of the semiconductor element and the hard substrate; a first wiring configured to connect in parallel the first electrodes of each of the plurality of semiconductor elements, the first wiring being provided on the hard substrate and the soft substrate; and a second wiring configured to connect in parallel the second electrodes of each of the plurality of semiconductor elements, the second wiring being provided on the hard substrate and the soft substrate, wherein all of the hard substrates of each of the plurality of semiconductor elements are connected by the soft substrate.

According to yet another aspect of an embodiment, a power conversion apparatus includes the above wiring board; and the plurality of semiconductor elements.

DETAILED DESCRIPTION OF THE
EMBODIMENTS

In order to prevent a switching deviation of the multiple semiconductor elements that are connected in parallel, it is desirable that the wiring length between the driving circuit and each semiconductor element is configured to be approximately the same.

However, in Patent Document 1, a substrate for wiring the gate terminal (base terminal) and the source terminal (emitter terminal) is provided for each of the multiple semiconductor elements, and the wiring length between the driving circuit and the gate terminal and the source terminal of each semiconductor element is made approximately the same, according to a structure in which the substrates are connected by connectors and wiring. Therefore, for example, in order to adjust the wiring length, it may be necessary to adopt a route that goes through another board that is different from the board on which the target gate terminal exists, and the wiring length between the driving circuit and the gate terminal of the semiconductor element may become longer. As a result, due to the increase in parasitic inductance associated with the increase in wiring length, it may not be possible to bring out the performance of the semiconductor element, and the increase in parasitic impedance may cause a gate oscillation phenomenon. Further, for example, poor assembly or the addition of mechanical vibration may cause poor contact at the connector fitting. Thus, there is margin for improvement in terms of reliability.

Therefore, in view of the above problems, it is desirable to provide a technology that can further improve the reliability when driving multiple semiconductor elements that are connected in parallel, by a single driving circuit.

According to an embodiment of the present disclosure, reliability can be further improved when multiple semiconductor elements that are connected in parallel, are driven by a single driving circuit.

Embodiments will be described below with reference to the drawings.

First Example of Wiring Board

A first example of a wiring board 400 according to the present embodiment will be described with reference to FIGS. 1 to 3.

Figure 1:
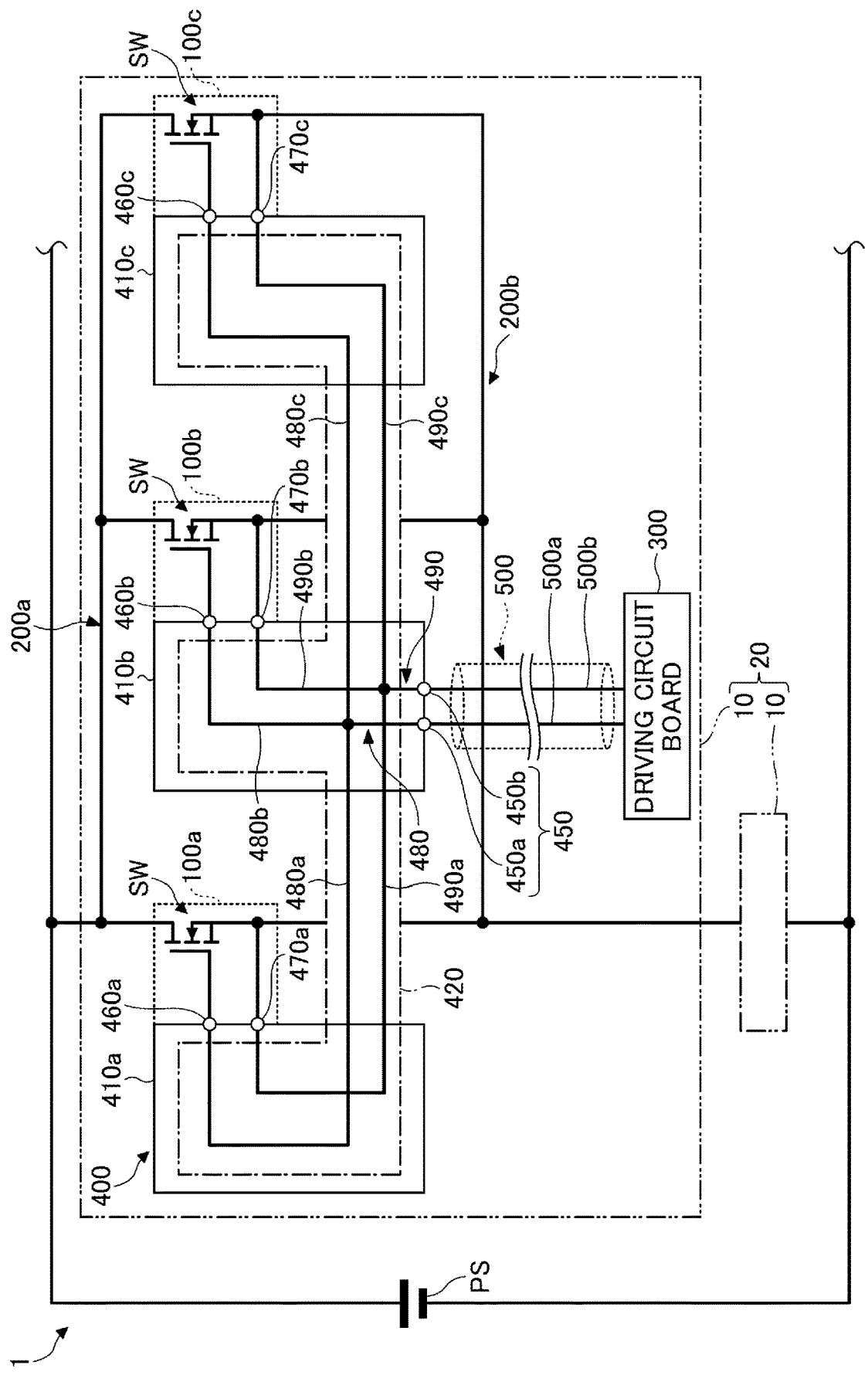
FIG. 1 is a circuit diagram illustrating an example of a power conversion apparatus including a first example of a wiring board.

FIG. 1 is a circuit diagram illustrating an example of a power conversion apparatus 1 including the first example of the wiring board 400. FIG. 2 is a perspective view illustrating the first example of the wiring board 400. FIG. 3 is a top view illustrating the first example of the wiring board 400.

Hereafter, explanations may be made by using an orthogonal coordinate system defined by the X, Y and Z axes in the figure. In some cases, the positive X-axis direction and the negative X-axis direction are collectively referred to as the X-axis direction, the positive Y-axis direction and the negative Y-axis direction are collectively referred to as the Y-axis direction, and the positive Z-axis direction and the negative Z-axis direction are collectively referred to as the Z-axis direction.

The power conversion apparatus 1 converts, for example, the power of a DC power supply PS into a predetermined power (for example, three-phase AC power at a predetermined voltage and a predetermined frequency) and supplies the power to a predetermined load. The power conversion apparatus 1 is mounted on, for example, industrial machinery for factories, moving objects such as railway vehicles, automobiles, and the like.

The power conversion apparatus 1 has an arm part 10 including a semiconductor switch element SW, and a leg part 20, which is configured by two arm parts 10 connected in series, provided between the positive and negative lines of the DC power supply PS. For example, the power conversion apparatus 1 is an inverter device capable of outputting three-phase AC power by connecting three leg parts 20 in parallel between the positive and negative lines of the DC power supply PS.

The arm part 10 includes semiconductor modules 100a to 100c, wirings 200a and 200b, a driving circuit board 300, the wiring board 400, and an electric circuit 500.

The semiconductor modules 100a to 100c each include the semiconductor switch element SW.

The semiconductor switch element SW (an example of a semiconductor element) is a voltage-driven type, for example, a MOSFET (Metal Oxide Semiconductor Field Effect Transistor) as illustrated in FIG. 1. The semiconductor switch element SW may be an IGBT (Insulated Gate Bipolar Transistor) or a HEMT (High Electron Mobility Transistor), etc. The semiconductor switch element SW is configured by, for example, silicon (silicon: Si) as the main material. The semiconductor switch element SW may be configured by a wide bandgap semiconductor material as the main material. The wide bandgap semiconductor materials are, for example, silicon carbide (silicon carbide: SiC), gallium nitride (gallium nitride: GaN), gallium oxide (gallium oxide: $Ga_2O_3$), carbon (diamond: C), etc.

Figure 2:
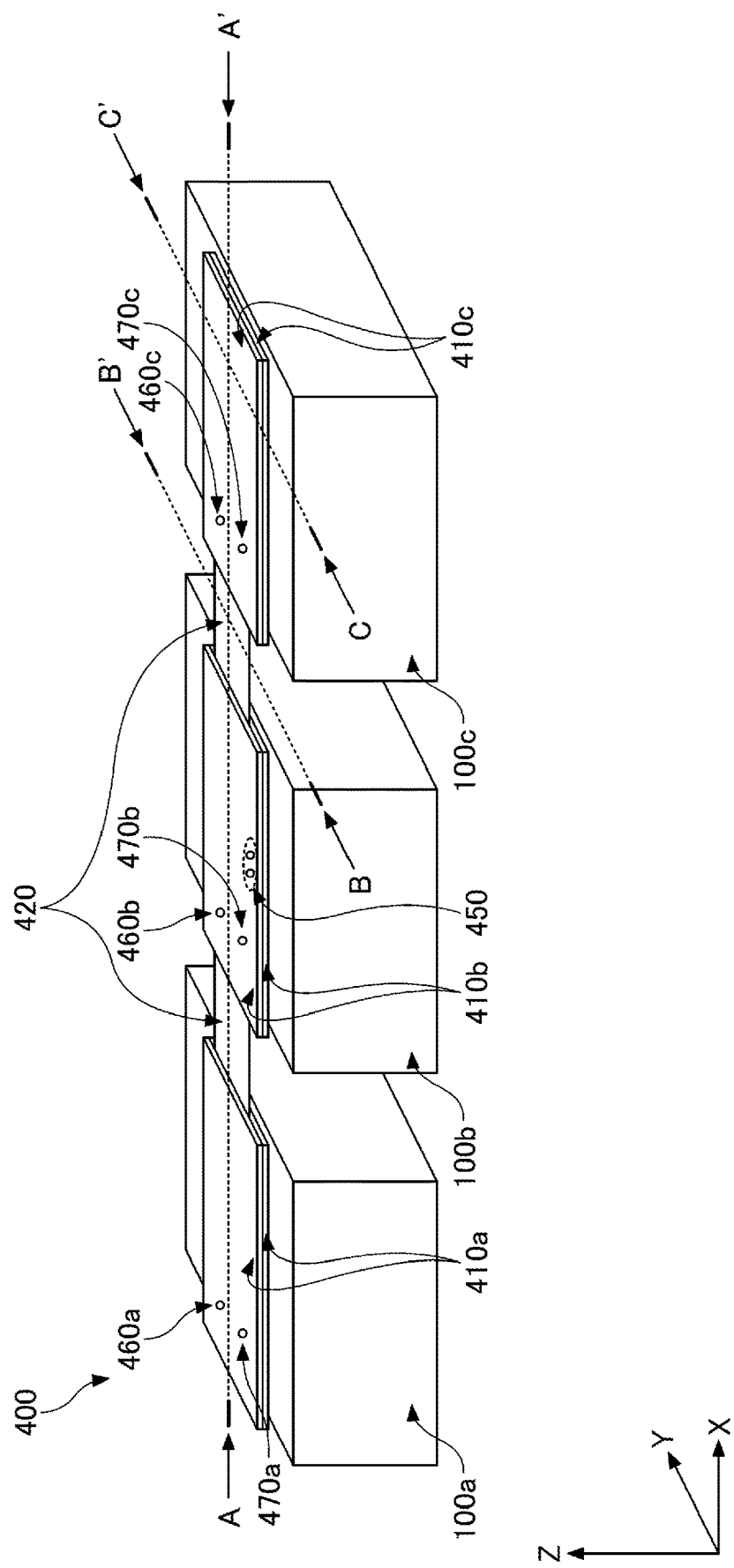
FIG. 2 is a perspective view illustrating the first example of a wiring board.
Figure 3:
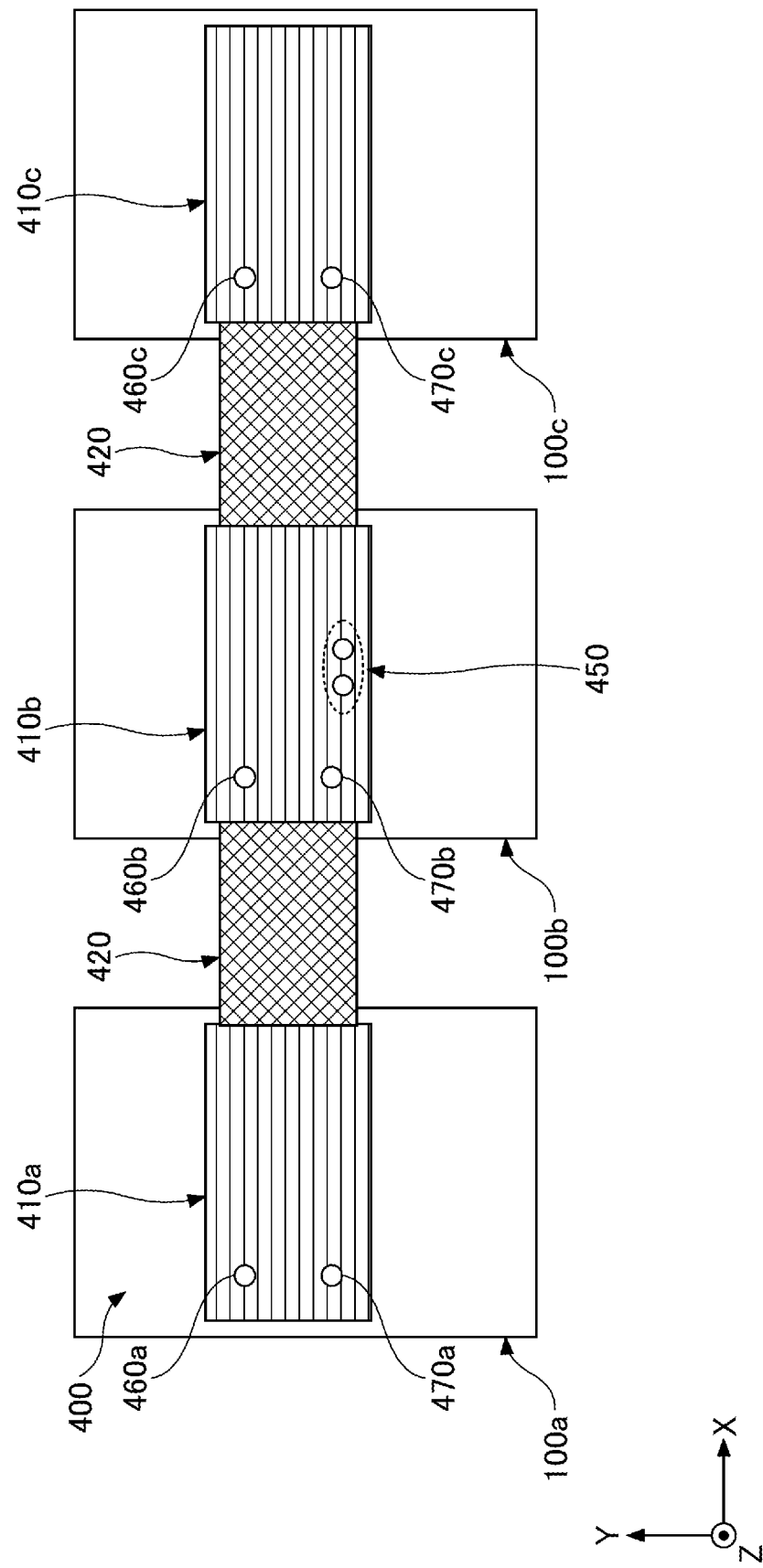
FIG. 3 is a top view illustrating the first example of a wiring board.

For example, as illustrated in FIGS. 2 and 3, each of the semiconductor modules 100a to 100c have an approximately rectangular solid shape with each side along one the X, Y, and Z axes, and are arranged so as to be approximately equally spaced apart in the X direction. "Approximately" is intended, for example, to allow manufacturing errors, etc., and is used in the same sense below.

The wirings 200a and 200b are used to connect multiple (in this example, three) semiconductor modules 100a to 100c (that is, multiple semiconductor switch elements SW) in parallel. Specifically, the wiring 200a is provided to connect the drain terminals of the multiple semiconductor switch elements SW, that is, the drain electrodes of the multiple semiconductor modules 100a to 100c, to each other. The wiring 200b connects the source terminals of the multiple semiconductor switch elements SW (an example of a reference potential terminal), that is, the source electrodes of the multiple semiconductor modules 100a, to each other.

If the semiconductor switch element SW is a bipolar transistor such as an IGBT, the source terminal, the drain terminal, and the gate terminal (an example of a control terminal) are replaced with an emitter terminal (an example of a reference potential terminal), a collector terminal, and a base terminal (an example of a control terminal), respectively.

The driving circuit board 300 is a board on which the driving circuits of multiple semiconductor switch elements SW are mounted.

In the wiring board 400, wiring for driving the multiple semiconductor modules 100a to 100c (that is, multiple semiconductor switch elements SW) by a driving circuit is mounted. The wiring board 400 includes hard substrates 410a to 410c (also referred to as a "rigid board"), a soft substrate 420 (also referred to as a "flexible board"), an electrode 450, electrodes 460a to 460c, electrodes 470a to 470c, and wirings 480 and 490.

The connection and fixation between the wiring board 400 (for example, the hard substrates 410a to 410c) and the semiconductor modules 100a to 100c may be implemented by any method. For example, the connection and fixation between the wiring board 400 and the semiconductor modules 100a to 100c are implemented by means of co-tightening by screws, pressure bonding by applying pressure, etc.

The hard substrates 410a to 410c are provided to correspond to the semiconductor modules 100a to 100c, respectively. The hard substrates 410a to 410c may be formed of any material. For example, the hard substrates 410a to 410c are glass epoxy substrates or the like.

For example, as illustrated in FIGS. 2 and 3, the hard substrate 410a is provided on the top surface (that is, the end face in the positive Z-axis direction) of the semiconductor module 100a. The hard substrate 410a has a flat plate shape approximately parallel to the X and Y axes and an approximately rectangular shape with each side in one of the X and Y axes directions in a top view. Two hard substrates 410a are provided. The two hard substrates 410a function as a pair of hard substrates 410a as described below.

For example, as illustrated in FIGS. 2 and 3, the hard substrate 410b is provided on the top surface (that is, the end face in the positive Z-axis direction) of the semiconductor module 100b. Similar to the hard substrate 410a, the hard substrate 410b has a flat plate shape that is approximately parallel to the X and Y axes, and an approximately rectangular shape with each side in one of the X and Y axes directions in a top view. Similar to the hard substrate 410a, two hard substrates 410b are provided. The two hard substrates 410b function as a pair of hard substrates 410b as described below.

For example, as illustrated in FIGS. 2 and 3, the hard substrate 410c is provided at approximately the center of the top surface (that is, the end face in the positive Z-axis direction) of the semiconductor module 100c in the X-axis and Y-axis directions. Similar to the hard substrates 410a and 410b, the hard substrate 410c has a flat plate shape that is approximately parallel to the X and Y axes, and has an approximately rectangular shape with each side in one of the X and Y axes directions in a top view. Similar to the hard substrate 410a, two hard substrates 410b are provided. The two hard substrates 410b function as a pair of hard substrates 410c as described below.

The soft substrate 420 is provided so as to be sandwiched between all of the pair of hard substrates 410a, the pair of hard substrates 410b, and the pair of hard substrates 410c. The soft substrate 420 can be made of any material. For example, the soft substrate 420 is a polyimide substrate or the like.

The soft substrate 420, for example, as illustrated in FIGS. 2 and 3, has an approximately rectangular shape that is approximately parallel to the X and Y axes and whose X axis dimension is longer than the Y axis dimension. Specifically, the soft substrate 420 has a Y-axis dimension approximately equal to or smaller than that of the hard substrates 410a to 410c and an X-axis dimension approximately equal to the distance between the end face in the negative X-axis direction of the hard substrate 410a and the end face of the positive X-axis direction of the hard substrate 410c. The soft substrate 420 is sandwiched from above and below (that is, the positive Z-axis direction and the negative Z-axis direction) at the end thereof in the negative X-axis direction by the pair of hard substrates 410a, sandwiched from above and below at the center thereof in the X-axis direction by the pair of hard substrates 410b, and sandwiched from above and below at the end thereof in the positive X-axis direction by the pair of hard substrates 410c. Thus, on the semiconductor module 100a (the positive Z-axis side), the hard substrate 410a, the soft substrate 420, and the hard substrate 410a are stacked in order from the bottom (negative Z-axis side). Similarly, on the semiconductor module 100b, the hard substrate 410b, the soft substrate 420, and the hard substrate 410b are stacked in order from the bottom. Similarly, on the semiconductor module 100c, the hard substrate 410c, the soft substrate 420, and the hard substrate 410c are stacked in order from the bottom. Then, in the X-axis direction, the soft substrate 420 is exposed in the range between the pair of hard substrates 410a and the pair of hard substrates 410b that are adjacent to each other, and is also exposed in the range between the pair of hard substrates 410b and the pair of hard substrates 410c that are adjacent to each other.

The soft substrate 420 is electrically connected to at least one of the two hard substrates 410a. For the connection between the soft substrate 420 and the hard substrate 410a, for example, a general via hole is used. The via hole may be a through-via, a stacked via, a buried via, etc. The same may be applied to the via hole used for the via connection described below. For the connection between the soft substrate 420 and the hard substrate 410a, any known method such as copper inlay or copper backfill via may be used.

The electrode 450 is used to connect the driving circuit board 300 through the electric circuit 500. For example, as illustrated in FIGS. 2 and 3, the electrode 450 is provided at the center of the hard substrate 410b in the X-axis direction and at the end of the hard substrate 410b in the negative Y-axis direction. The electrode 450 includes an electrode 450a (third electrode) and an electrode 450b.

The electrode 460a (an example of the first electrode) is connected to the gate electrode of the semiconductor module 100a, that is, the gate terminal of the semiconductor switch element SW included in the semiconductor module 100a. For example, as illustrated in FIG. 2, the electrode 460a is provided on the upper hard substrate 410a where the surface in the positive Z-axis direction of the pair of hard substrates 410a is exposed. The electrode 460a may be provided on the hard substrate 410a on the lower side (negative Z-axis direction) of the pair of hard substrates 410a, or on the part of the soft substrate 420 between the two hard substrates 410a.

For example, as illustrated in FIG. 2 and FIG. 3, the electrode 460a is provided at a position of the upper hard substrate 410a toward the negative X-axis direction and the positive Y-axis direction.

The electrode 460b (an example of the first electrode) is connected to the gate electrode of the semiconductor module 100b, that is, the gate terminal of the semiconductor switch element SW included in the semiconductor module 100b. For example, as illustrated in FIGS. 2 and 3, the electrode 460b is provided on the upper hard substrate 410b where the surface in the positive Z-axis direction of the pair of hard substrates 410b is exposed. Further, the electrode 460b may be provided on the hard substrate 410b on the lower side (negative Z-axis direction) of the pair of hard substrates 410b or on the part of the soft substrate 420 between the two hard substrates 410b.

For example, as illustrated in FIG. 2 and FIG. 3, the electrode 460b is provided at a position of the upper hard substrate 410b toward the negative X-axis direction and the positive Y-axis direction.

The electrode 460c (an example of the first electrode) is connected to the gate electrode of the semiconductor module 100c, that is, the gate terminal of the semiconductor switch element SW included in the semiconductor module 100c. For example, as illustrated in FIGS. 2 and 3, the electrode 460c is provided on the upper hard substrate 410c where the surface in the positive Z-axis direction of the pair of hard substrates 410c is exposed. Further, the electrode 460c may be provided on the hard substrate 410c on the lower side (negative Z-axis direction) of the pair of hard substrates 410c or on the part of the soft substrate 420 between the two hard substrates 410c.

For example, as illustrated in FIG. 2 and FIG. 3, the electrode 460c is provided at a position on the upper hard substrate 410c toward the negative X-axis direction and the positive Y-axis direction.

The electrode 470a (an example of the second electrode) is connected to the source electrode of the semiconductor module 100a, that is, the source terminal of the semiconductor switch element SW included in the semiconductor module 100a. For example, as illustrated in FIGS. 2 and 3, the electrode 470a is provided on the upper hard substrate 410a where the surface in the positive Z-axis direction of the pair of hard substrates 410a is exposed. The electrode 470a may be provided on the hard substrate 410a on the lower side (negative Z-axis direction) of the pair of hard substrates 410a, or on the part of the soft substrate 420 between the two hard substrates 410a.

For example, as illustrated in FIG. 2 and FIG. 3, the electrode 470a is provided at a position of the upper hard substrate 410a toward the negative X-axis direction and the negative Y-axis direction.

The electrode 470b (an example of the second electrode) is connected to the source electrode of the semiconductor module 100b, that is, the source terminal of the semiconductor switch element SW included in the semiconductor module 100b. For example, as illustrated in FIGS. 2 and 3, the electrode 470b is provided on the upper hard substrate 410b where the surface in the positive Z-axis direction of the pair of hard substrates 410b is exposed. Further, the electrode 470b may be provided on the hard substrate 410b on the lower side (negative Z-axis direction) of the pair of hard substrates 410b or on the part of the soft substrate 420 between the two hard substrates 410b.

For example, as illustrated in FIGS. 2 and 3, the electrode 470b is provided at a position on the upper hard substrate 410b toward the negative X-axis direction and the negative Y-axis direction.

The electrode 470c (an example of the second electrode) is connected to the source electrode of the semiconductor module 100c, that is, the source terminal of the semiconductor switch element SW included in the semiconductor module 100c. For example, as illustrated in FIGS. 2 and 3, the electrode 470c is provided on the upper hard substrate 410c where the surface in the positive Z-axis direction of the pair of hard substrates 410c is exposed. Further, the electrode 470c may be provided on the hard substrate 410c on the lower side (negative Z-axis direction) of the pair of hard substrates 410c or on the part of the soft substrate 420 between the two hard substrates 410c.

For example, as illustrated in FIG. 2 and FIG. 3, the electrode 470c is provided at a position of the upper hard substrate 410c toward the negative X-axis direction and the negative Y-axis direction.

In addition to the electrodes 460a to 460c and the electrodes 470a to 470c, the wiring board 400 may be provided with electrodes (auxiliary terminals) for monitoring the state of the respective semiconductor switch elements SW of the semiconductor modules 100a to 100c. The auxiliary terminal is, for example, a high-pressure auxiliary terminal used for a proof-pressure test.

The wiring 480 (an example of the first wiring) connects electrodes 460a to 460c in parallel. Specifically, the wiring 480 connects between the electrode 450a and each of the electrodes 460a to 460c. The wiring 480 includes wirings 480a to 480c.

The wiring 480a is a wiring portion in the wiring 480 connecting between the electrodes 450a and 460a. The wiring 480b is a wiring portion in the wiring 480 connecting between electrodes 450a and 460b. The wiring 480c is a wiring portion in the wiring 480 connecting between the electrodes 450a and 460c. The wirings 480a to 480c may be provided independently of each other or may be partially common with the electrode 450a as the starting point.

The wiring 480 is mainly provided on the soft substrate 420. The wiring 480 is, for example, primarily arranged on the soft substrate 420 and also provided on at least one of the hard substrates 410a to 410c for the purpose of connection with components, electrodes, etc., of the hard substrates 410a to 410c. Further, the wiring 480 may be provided only on the soft substrate 420 among the hard substrates 410a to 410c and the soft substrate 420.

The wiring 490 (an example of the second wiring) connects the electrodes 470a to 470c in parallel. Specifically, the wiring 490 connects between the electrode 450b and each of the electrodes 470a to 470c. The wiring 490 includes wirings 490a to 490c.

The wiring 490a is a wiring portion in the wiring 490 connecting between the electrodes 450b and 470a. The wiring 490b is a wiring portion in the wiring 490 connecting between the electrodes 450b and 470b. The wiring 490c is a wiring portion in the wiring 490 connecting between electrodes 450b and 470c. The wirings 490a to 490c may be provided independently of each other or may be partially common with the electrode 450b as the starting point.

The wiring 490 is provided, for example, on the soft substrate 420 and at least one of the hard substrates 410a to 410c. Further, the wiring 490 may be provided only on the soft substrate 420 among the hard substrates 410a to 410c and the soft substrate 420.

The electric circuit 500 connects between the driving circuit board 300 and the electrode 450 of the wiring board 400. The electrical circuit 500 includes electrical circuits 500a and 500b.

The electric circuit 500a connects between the driving circuit board 300 and the electrode 450a of the wiring board 400. The electric circuit 500b connects between the driving circuit board 300 and the electrode 450b of the wiring board 400.

Thus, the wiring board 400 is configured as a rigid flexible board with a combination of the hard substrates 410a to 410c and the soft substrate 420. Specifically, part of the wiring board 400 has a stacked structure in which each of the pair of hard substrates 410a, the pair of hard substrates 410b, and the pair of hard substrates 410c is an outer layer and the soft substrate 420 is an inner layer. The hard substrates 410a to 410c for each of the multiple semiconductor modules 100a to 100c can be connected to each other in such a way that the soft substrate 420 is sandwiched between the two hard substrates 410a, between the two hard substrates 410b, and between the two hard substrates 410c.

For example, when hard substrates 410a to 410b are electrically connected to each other by a connection method using connectors, the wiring lengths between the electrode 450a and each of the electrodes 460a to 460c are matched, and, therefore, the absolute value of the wiring length may become large. This is because it is necessary to adjust the length of the path by running the wiring outward and back along the connecting path by the connector. As a result, the performance of the semiconductor switch element SW may not be fully brought out due to the increase in parasitic inductance caused by the increase in the wiring length. Further, a gate oscillation phenomenon may occur due to an increase in parasitic impedance due to an increase in the wiring length. Further, poor connection may occur in the connector fitting due to poor assembly or mechanical vibration. In particular, when the power conversion apparatus 1 is mounted on a moving object such as a railway vehicle or an automobile, mechanical vibration is likely to be applied, which may increase the concern of poor connection. Connectors can also lead to an increase in the dimension in the height direction (Z-axis direction), which may hinder an attempt of reducing the dimension in the height direction (lowering the height). In particular, in the case of automobiles, the space for mounting components is extremely limited and there is a high need for a low height, and, therefore, there may be a significant impact on the ability to be mounted on automobiles.

In contrast, in this example, the wiring length between the electrode 450a and each of the electrodes 460a to 460c corresponding to the gate electrode for each of the semiconductor modules 100a to 100c can be adjusted by the wiring pattern in the hard substrates 410a to 410c and the soft substrate 420. Therefore, the degree of freedom of the wiring pattern makes it possible to prevent an increase in the wiring length when matching the wiring length between the electrode 450a and each of the electrodes 460a to 460c. As a result, the performance of the semiconductor switch element SW can be brought out to a desired level and the occurrence of gate oscillation phenomenon can be prevented. Moreover, connectors are not used for the interconnection of the hard substrates 410a to 410c, and, therefore, the occurrence of connection failure problems can be prevented and the height of the wiring board 400 can be reduced. Therefore, the wiring board 400 with higher reliability and operation stability can be implemented. Moreover, a manufacturing process for fitting a connector is not required, and labor saving in assembly work, improvement in manufacturing efficiency, reduction in manufacturing cost and the like can be achieved.

Second Example of Wiring Board

Next, a second example of the wiring board 400 according to the present embodiment will be described with reference to FIGS. 4 to 6.

Hereafter, the explanation will focus on the parts different from the first example above, and the same or corresponding content as the first example above may be omitted.

Figure 4:
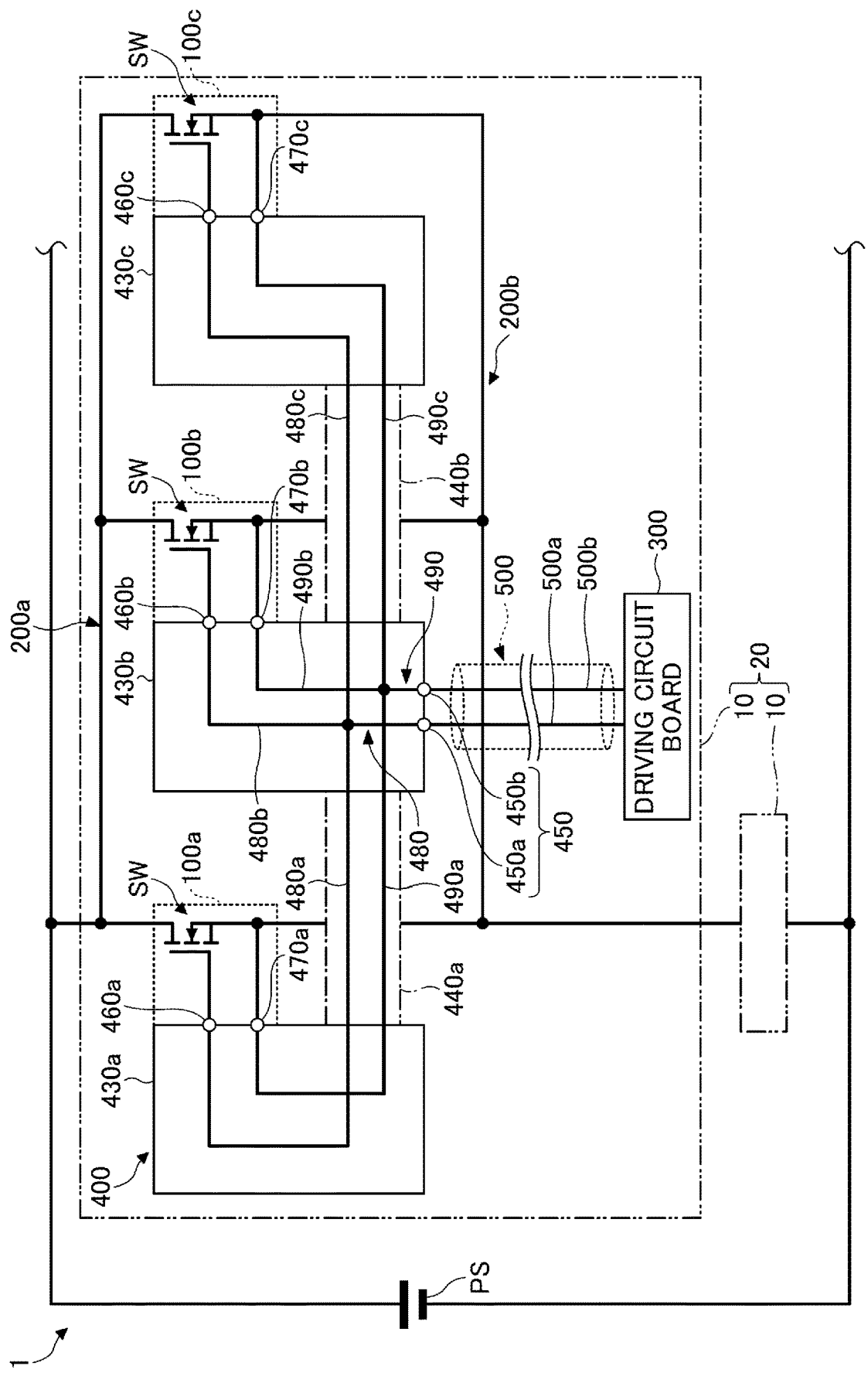
FIG. 4 is a circuit diagram illustrating one example of a power conversion apparatus including a second example of a wiring board.

FIG. 4 is a circuit diagram illustrating an example of the power conversion apparatus 1 including a second example of the wiring board 400. FIG. 5 is a perspective view illustrating a second example of the wiring board 400. FIG. 6 is a top view illustrating a second example of the wiring board 400.

The wiring board 400 includes hard substrates 430a to 430c, soft substrates 440a and 440b, the electrode 450, the electrodes 460a to 460c, the electrodes 470a to 470c, and the wirings 480 and 490.

The hard substrates 430a to 430c are provided to correspond to the semiconductor modules 100a to 100c, respectively.

Figure 5:
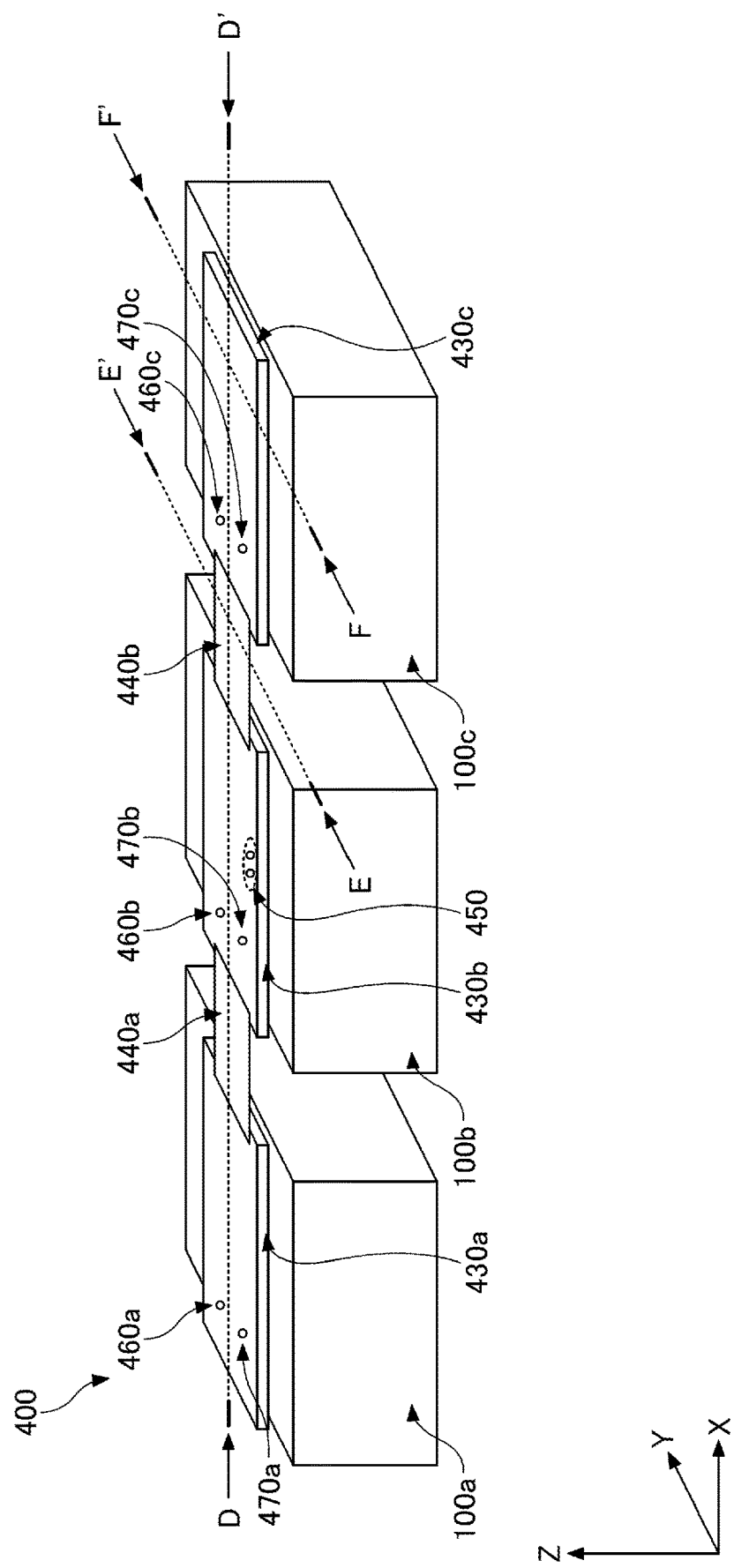
FIG. 5 is a perspective view illustrating a second example of a wiring board.
Figure 6:
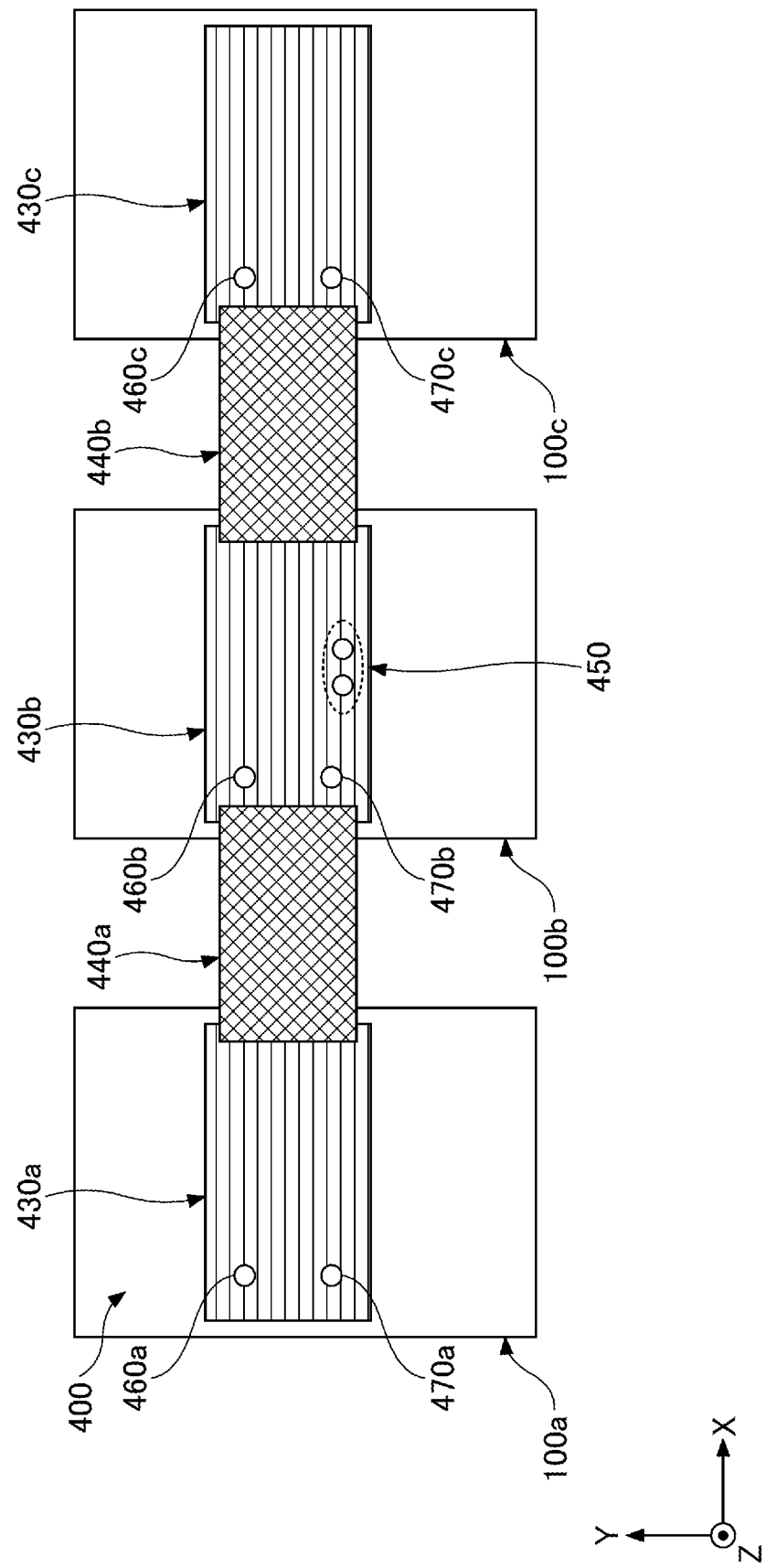
FIG. 6 is a top view illustrating the second example of a wiring board.

For example, as illustrated in FIGS. 5 and 6, the hard substrate 430a is provided on the top surface (that is, the positive Z-axis end face) of the semiconductor module 100a. The hard substrate 430a has a flat plate shape approximately parallel to the X and Y axes and an approximately rectangular shape with each side in one of the X and Y axes directions in a top view.

For example, as illustrated in FIGS. 5 and 6, the hard substrate 430b is provided on the top surface (that is, the positive Z-axis end face) of the semiconductor module 100b. The hard substrate 430b, similar to the hard substrate 430a, has a flat plate shape that is approximately parallel to the X and Y axes, and an approximately rectangular shape with each side in one of the X and Y axes directions in a top view.

For example, as illustrated in FIGS. 5 and 6, the hard substrate 430c is provided at approximately the center of the top surface (that is, the positive Z-axis end face) of the semiconductor module 100c in the X-axis and Y-axis directions. The hard substrate 430c, similar to the hard substrates 430a and 430b, has a flat plate shape that is approximately parallel to the X and Y axes, and has an approximately rectangular shape with each side in one of the X and Y axes directions in a top view.

Each of the ends of the soft substrate 440a is electrically connected to one of the hard substrates 430a and 430b so as to connect between the hard substrates 430a and 430b. For example, as illustrated in FIG. 5 and FIG. 6, the soft substrate 440a has a flat plate shape approximately parallel to the X and Y axes and has an approximately rectangular shape with each side extending in one of the X and Y axes directions in a top view. In the soft substrate 440a, the negative X-axis end is electrically connected to the upper surface (the positive Z-axis end) of the hard substrate 430a, and the positive X-axis end is electrically connected to the upper surface of the hard substrate 430b.

Each of the ends of the soft substrate 440b is electrically connected to one of the hard substrates 430b and 430c so as to connect between the hard substrates 430b and 430c. For example, as illustrated in FIGS. 5 and 6, the soft substrate 440b has a flat plate shape approximately parallel to the X and Y axes and an approximately rectangular shape with each side extending in the X and Y axes directions in a top view. In the soft substrate 440b, the negative X-axis end is electrically connected to the upper surface of the hard substrate 430b (the positive Z-axis end surface), and the positive X-axis end is electrically connected to the upper surface of the hard substrate 430b.

The electrical connection between the soft substrate 440a and the hard substrates 430a and 430b may be implemented by any joining method. The electrical connection between the soft substrate 440a and the hard substrates 430a and 430b is implemented, for example, by joining with solder or the like. The same may be applied to the electrical connection between the soft substrate 440b and the hard substrates 430b and 430c. Further, mechanical connection (holding) between the soft substrate 440a and the hard substrates 430a and 430b may be implemented by any method. Mechanical connection (holding) between the soft substrate 440a and the hard substrates 430a and 430b is implemented, for example, by joining with solder, resin, etc. The same may be applied to the mechanical connection (holding) between the soft substrate 440b and the hard substrates 430b and 430c.

The wiring 480 is arranged on the hard substrates 430a to 430c and the soft substrates 440a and 440b. The same applies to the wiring 490.

Thus, in this example, the wiring board 400 has a configuration equivalent to that of a rigid flexible board formed by a combination of the hard substrates 430a to 430c and the soft substrates 440a and 440b. Specifically, the wiring board 400 has a structure in which the hard substrates 430a to 430c corresponding to the multiple semiconductor modules 100a to 100c, respectively, are electrically connected to each other by the soft substrates 440a and 440b.

Thus, in this example, the wiring length between the electrode 450a and each of the electrodes 460a to 460c can be adjusted according to the wiring patterns in the hard substrates 430a to 430c and the soft substrates 440a and 440b. Therefore, as in the case of the first example above, the degree of freedom of the wiring pattern makes it possible to prevent an increase in the wiring length when matching the wiring length between the electrode 450a and each of the electrodes 460a to 460c. As a result, the performance of the semiconductor switch element SW can be brought out to a desired level and the occurrence of gate oscillation phenomenon can be prevented. Moreover, connectors are not used for the interconnection of the hard substrates 410a to 410c, and, therefore, the occurrence of connection failure problems can be prevented and the height of the wiring board 400 can be reduced. Therefore, the wiring board 400 with higher reliability and operation stability can be implemented. Moreover, a manufacturing process for fitting a connector is not required, and labor saving in assembly work, improvement in manufacturing efficiency, reduction in manufacturing cost and the like can be achieved. Moreover, the hard substrates 430*a* to 430*c* and the soft substrates 440*a* and 440*b* need only be joined by known methods, and, therefore, the adoption of simpler processes can further promote labor-saving of assembly work, improvement of manufacturing efficiency, and reduction of manufacturing cost.

Third Example of Wiring Board

Next, a third example of the wiring board 400 according to the present embodiment will be described with reference to FIG. 7.

Hereafter, the explanation will focus on the parts that are different from examples 1 and 2 above, and the same or corresponding content as examples 1 and 2 above may be omitted. In this example, the circuit diagram of the power conversion apparatus 1 including the wiring board 400, the perspective view of the wiring board 400, and the top view of the wiring board 400 are the same as in the above second example, so the illustration is omitted, and the explanation is made by referring to FIGS. 4 to 6 of the above second example.

Figure 7:
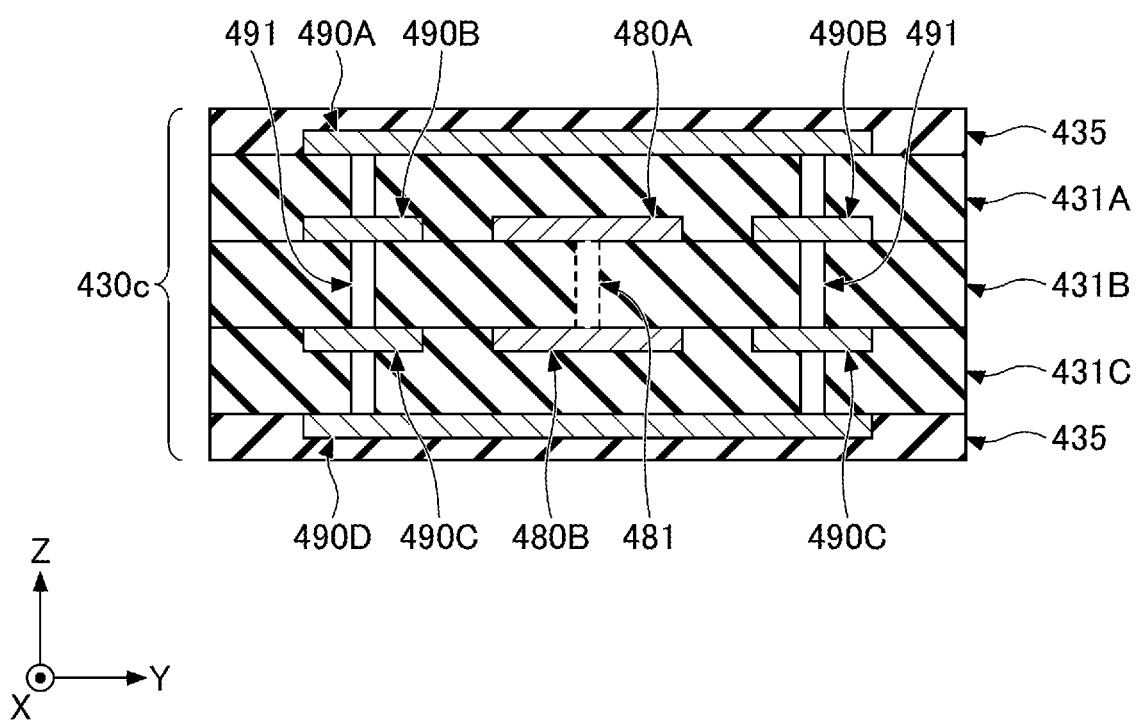
FIG. 7 is a cross-sectional view illustrating a third example of a wiring board.

FIG. 7 is a cross-sectional view illustrating a third example of the wiring board 400. Specifically, FIG. 7 is a cross section of the line F-F' in FIG. 5.

In this example, the hard substrates 430*a* to 430*c* have the same structure as each other, and, therefore, a description of the hard substrate 430*c* will be mainly given as a representative example, and illustrations and descriptions of the hard substrates 430*a* and 430*b* will be omitted.

As illustrated in FIG. 7, the hard substrate 430*c* is a multilayer substrate including insulating layers 431A to 431C and a protective film 435.

The insulating layers 431A to 431C are stacked in the stated order from the top (that is, from the positive Z-axis direction). Further, wiring layers are provided on the surface of the insulating layer 431A in the positive Z-axis direction, between the insulating layers 431A and 431B (the surface of the insulating layer 431B in the positive Z-axis direction), between the insulating layers 431B and 431C (the surface of the insulating layer 431B in the negative Z-axis direction), and on the surface of the insulating layer 431C in the negative Z-axis direction. That is, four stacked wiring layers are provided in the hard substrate 430*c*.

The protective film 435 is provided on the surface of the insulating layer 431A in the positive Z-axis direction and the surface of the insulating layer 431C in the negative Z-axis direction. The protective film 435 is, for example, a solder resist.

As illustrated in FIG. 7, in this example, the wiring 480 includes wirings 480A and 480B as portions provided in the hard substrate 430*c*. In this example, the wiring 490 includes wirings 490A to 490C as portions provided in the hard substrate 430*c*.

The wiring 480A is provided, among the inner layers of the hard substrate 430*c*, on the inner layer in the positive Z-axis direction (hereafter, for the sake of convenience, the "first inner layer"), that is, on the surface of the insulating layer 431B in the positive Z-axis direction between the insulating layers 431A and 431B. For example, as illustrated in FIG. 7, the wiring 480A is arranged at the center in the Y-axis direction.

The wiring 480B is provided, among the inner layers of the hard substrate 430*c*, on the inner layer in the negative Z-axis side (hereafter, for the sake of convenience, the "second inner layer"), that is, on the surface of the insulating layer 431B in the negative Z-axis direction between the insulating layers 431B and 431C. For example, as illustrated in FIG. 7, similar to the wiring 480A, the wiring 480B is located at the center in the Y-axis direction.

The electrical connection between the wirings 480A and 480B is implemented by a connection part 481. The connection part 481 may implement an electrical connection between the wirings 480A and 480B by any method. The connection part 481 implements an electrical connection between the wirings 480A and 480B by, for example, via connection. Further, the connection part 481 may implement an electrical connection between the wirings 480A and 480B by copper inlay or the like.

The wiring 490A is provided on the outer layer of the hard substrate 430*c* in the positive Z-axis direction, that is, on the surface of the insulating layer 431A in the positive Z-axis direction. The wiring 490A is provided in a range including the entire area of the wirings 480A and 480B in the Y-axis direction.

The wiring 490B is provided in the first inner layer of the hard substrate 430*c*. The wiring 490B is located both between the wiring 480A and the positive Y-axis end of the hard substrate 430*c* and between the wiring 480A and the negative Y-axis end of the hard substrate 430*c*. That is, the wiring 490B is arranged to sandwich the wiring 480A in the Y-axis direction. For example, as illustrated in FIG. 7, the wiring 490B is arranged so that the position of the positive Y-axis end in the Y-axis direction approximately coincides with the position of the positive Y-axis end of the wiring 490A and the wiring 490D in the Y-axis direction. The same may apply to the position at the negative Y-axis end.

The wiring 490C is provided in the second inner layer of the hard substrate 430*c*. The wiring 490C is arranged both between the wiring 480B and the positive Y-axis end and between wiring 480B and the negative Y-axis end. That is, the wiring 490C is arranged to sandwich the wiring 480B in the Y-axis direction. For example, as illustrated in FIG. 7, the wiring 490C is arranged so that the position of the positive Y-axis end in the Y-axis direction approximately coincides with the position of the positive Y-axis end of the wiring 490A and the wiring 490D in the Y-axis direction. The same may apply to the position at the negative Y-axis end.

The wiring 490D is provided on the outer layer of the hard substrate 430*c* in the negative Z-axis direction, that is, on the surface of the insulating layer 431C in the negative Z-axis direction. The wiring 490D is provided in a range including the entire area of the wirings 480A and 480B in the Y-axis direction. For example, as illustrated in FIG. 7, the wiring 490D is arranged so that the position of the positive Y-axis end approximately coincides with the position of the positive Y-axis end of the wiring 490A. The same may apply to the position at the negative Y-axis end.

The electrical connection of the wirings 490A to 490D is implemented by a connection part 491. The connection part 491 may implement electrical connection of the wirings 490A to 480D by any method. The connection part 481 implements an electrical connection between the wirings 490A to 490D by, for example, via connection. Further, the connection part 491 may implement an electrical connection between the wirings 490A to 490D by copper inlay or the like.

For example, as illustrated in FIG. 7, the connection part 491 is provided on both the negative Y-axis side and the positive Y-axis side of the wirings 480A and 480B and the connection part 481 in the Y-axis direction.

Thus, in this example, the wiring 480 is arranged to be sandwiched between the wirings 490B and 490C in the Y-axis direction and between the wirings 490A and 490D in the Z-axis direction. The connection part 481 for connecting the layers of the wiring 480 may be arranged to be sandwiched between the connection parts 491 for connecting the layers of the wiring 490 in the Y-axis direction. Thus, the wiring 480 can be arranged so as to be surrounded by the wiring 490 when viewed from the X-axis direction in the hard substrate 430c. Therefore, the wiring 480 is electromagnetically shielded by the wiring 490 and the connection part 491, and as a result, the parasitic inductance component of the wiring 490 (the wirings 490A to 490D) of the hard substrate 430c can be prevented (canceled) Therefore, the gate oscillation phenomenon caused by the parasitic component of the wirings 480 and 490 and the imbalance of the current flowing through the semiconductor switch element SW can be prevented, and the wiring board 400 with higher reliability and operation stability can be implemented.

Fourth Example of Wiring Board

Next, a fourth example of the wiring board 400 according to the present embodiment will be described with reference to FIGS. 8 to 10.

The following discussion is focused on the parts that differ from the first to third examples above, and the same or corresponding content as the first to third examples above may be omitted. Further, in this example, the circuit diagram of the power conversion apparatus 1 including the wiring board 400, the perspective view of the wiring board 400, and the top view of the wiring board 400 are the same as in the first example described above, so the illustration is omitted, and the explanation is made by referring to FIGS. 1 to 3 of the first example described above.

Figure 8:
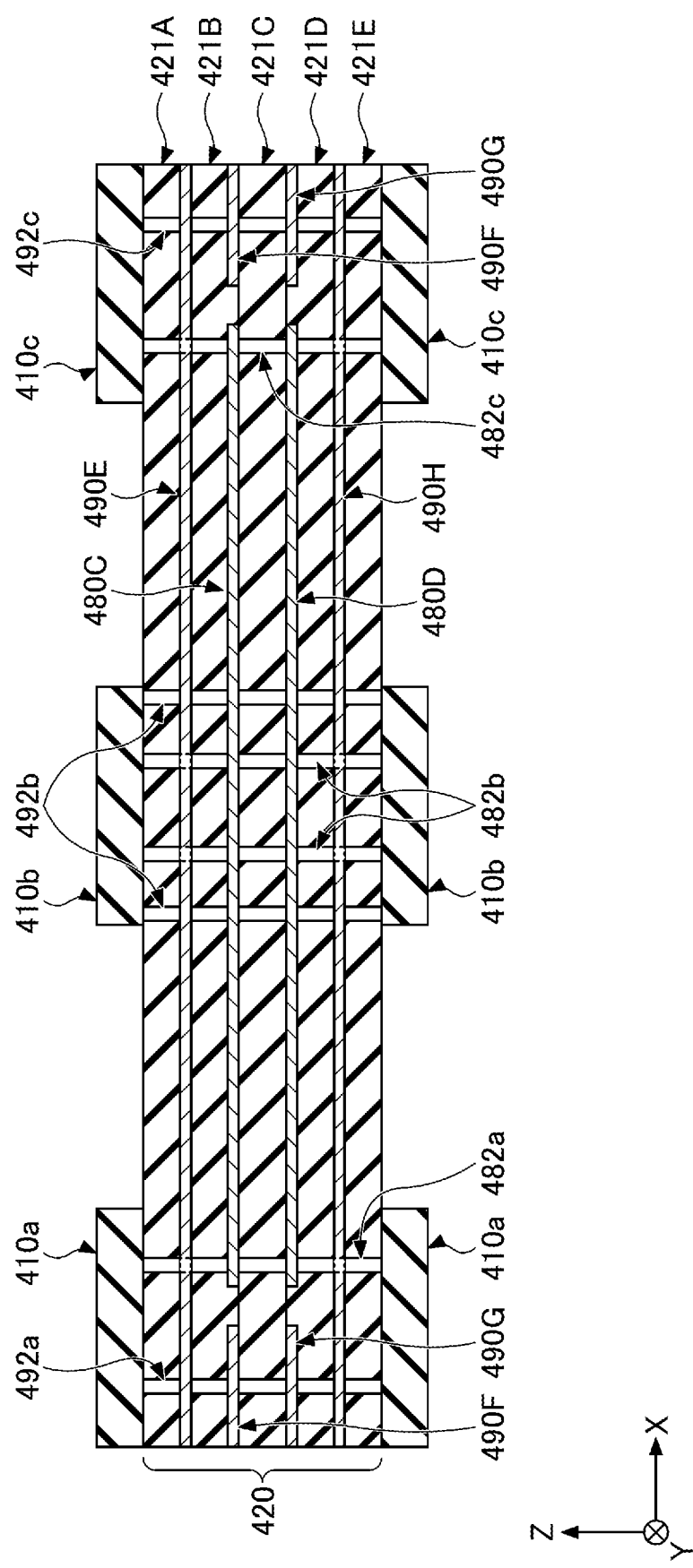
FIG. 8 is a cross-sectional view illustrating a fourth example of a wiring board.
Figure 9:
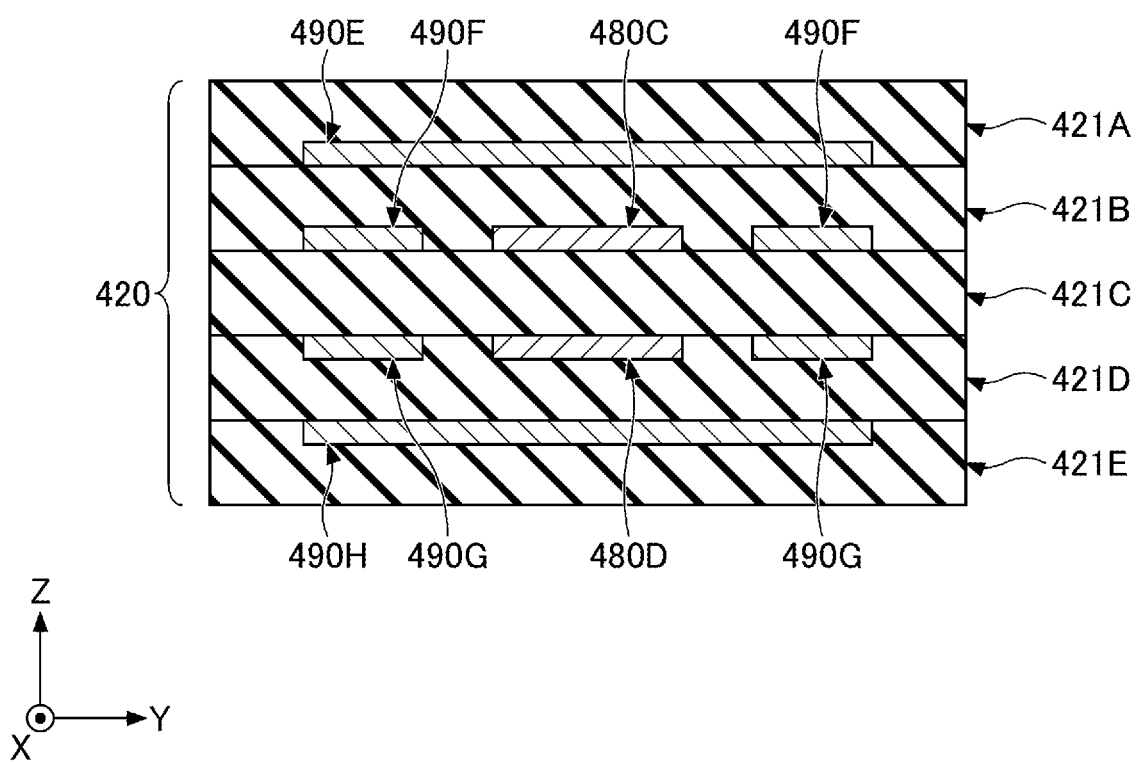
FIG. 9 is a cross-sectional view illustrating the fourth example of a wiring board.
Figure 10:
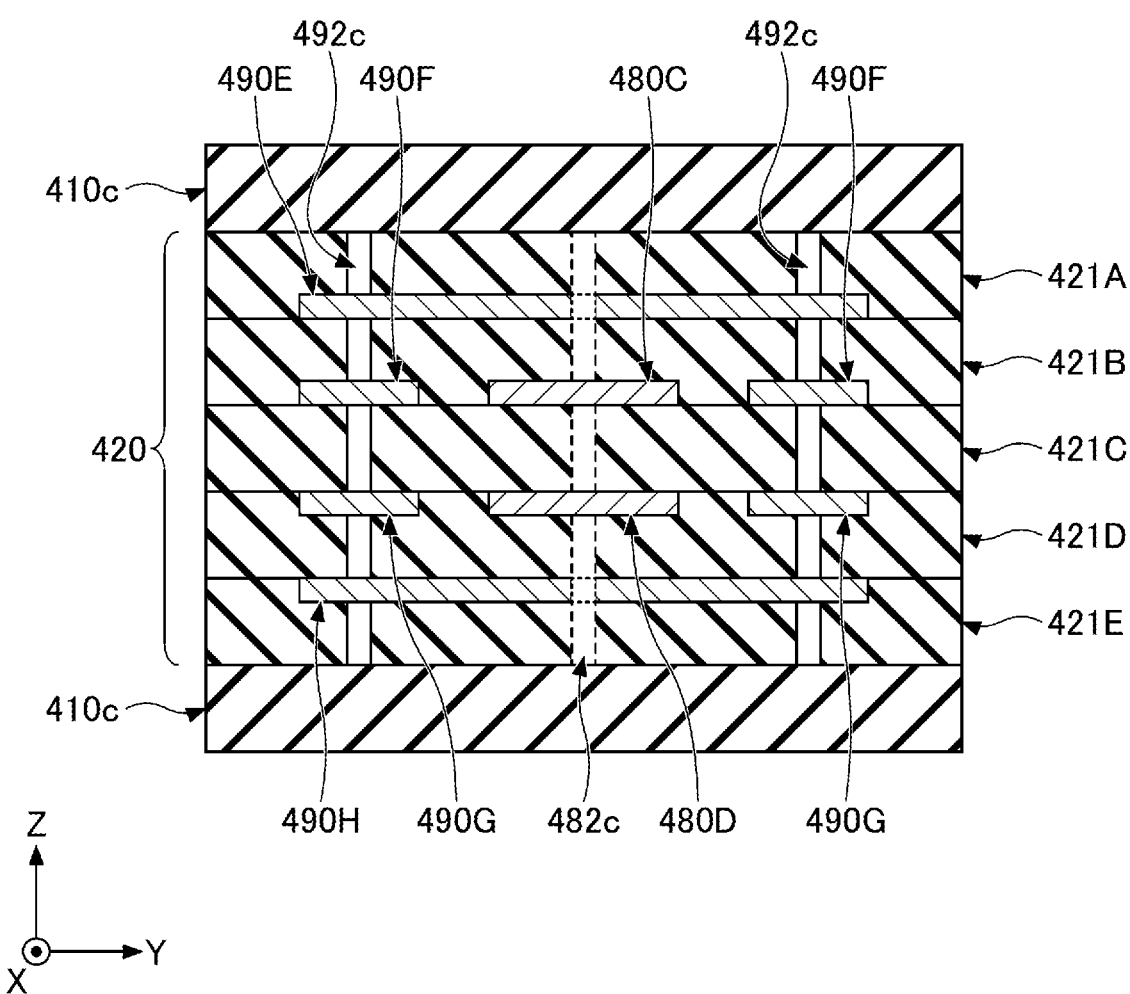
FIG. 10 is a cross-sectional view illustrating the fourth example of a wiring board.

FIGS. 8 to 10 are cross-sectional views illustrating the fourth example of the wiring board 400. Specifically, FIGS. 8 to 10 are cross-sectional views of lines A-A', B-B', and C-C' in FIG. 2.

A cross-sectional view in a plane parallel to the Y-axis and Z-axis of the soft substrate 420 at a point between the pair of hard substrates 410a and the pair of hard substrates 410b in the X-axis direction would be illustrated in the same manner as in FIG. 9, and therefore, the illustration is omitted. Further, a cross-sectional view in a plane parallel to the Y-axis and Z-axis of the wiring board 400 at a point where the soft substrate 420 is sandwiched by the two hard substrates 410a would be illustrated in the same manner as in FIG. 10, and therefore, the illustration is omitted. Specifically, this would be illustrated by a diagram in which a pair of hard substrates 410c, a connection part 482c, and a connection part 492c in FIG. 10 are each replaced by a pair of hard substrates 410a, a connection part 482a, and a connection part 492a. Further, a cross-sectional view in a plane parallel to the Y and Z axes of the wiring board 400 at a point where the soft substrate 420 is sandwiched by two hard substrates 410b would be illustrated in the same manner as in FIG. 10, and therefore, the illustration is omitted. Specifically, this would be illustrated by a diagram in which the pair of hard substrates 410c, the connection part 482c, and the connection part 492c in FIG. 10 are each replaced by a pair of hard substrates 410b, a connection part 482b, and a connection part 492b.

As illustrated in FIGS. 8 to 10, the soft substrate 420 includes insulating layers 421A to 421E.

The insulating layers 421A to 421E are stacked in the stated order from the top (that is, from the positive Z-axis direction). Further, four stacked wiring layers are provided between the insulating layers 421A and 421B (the surface of the insulating layer 421B in the positive Z-axis direction), between the insulating layers 421B and 421C (the surface of the insulating layer 421C in the positive Z-axis direction), between the insulating layers 421C and 421D (the surface of the insulating layer 421C in the negative Z-axis direction), and between the insulating layers 421D and 421E (that is, the surface of the insulating layer 421D in the negative Z-axis direction).

In this example, the wiring 480 includes wirings 480C and 480D as portions provided in the soft substrate 420.

The wiring 480C is provided, among the inner layers of the soft substrate 420, on the inner layer in the positive Z-axis direction (hereafter, for the sake of convenience, the "first inner layer"), that is, on the surface of the insulating layer 421C in the positive Z-axis direction between the insulating layers 421B and 421C. For example, as illustrated in FIG. 8, the wiring 480C is arranged approximately at the center in the X-axis direction in the first inner layer of the soft substrate 420. Specifically, the wiring 480C may be arranged in the first inner layer such that the positive X-axis end extends to the position in the X-axis direction where the hard substrate 410c exists and the negative X-axis end extends to the position in the X-axis direction where the hard substrate 410a exists. Further, for example, as illustrated in FIG. 9 and FIG. 10, the wiring 480C is arranged at the center in the Y-axis direction in the first inner layer.

The wiring 480D is provided, among the inner layers of the soft substrate 420, on the inner layer in the negative Z-axis direction (hereafter, for the sake of convenience, the "second inner layer"), that is, on the surface of the insulating layer 421C in the negative Z-axis direction between the insulating layers 421C and 421D. For example, as illustrated in FIG. 8, the wiring 480D is located approximately at the center in the X-axis direction in the second inner layer of the soft substrate 420. Specifically, the wiring 480D, similar to the wiring 480C, may be arranged in the second inner layer such that the positive X-axis end extends to the position in the X-axis direction where the hard substrate 410c exists and the negative X-axis end extends to the position in the X-axis direction where the hard substrate 410a exists. For example, as illustrated in FIG. 9 and FIG. 10, the wiring 480D, similar to the wiring 480C, is located at the center of the second inner layer in the Y-axis direction.

The electrical connection between the wirings 480C and 480D and the pair of hard substrates 410a is implemented by the connection part 482a. For example, as illustrated in FIG. 8, the connection part 482a connects wirings 480C and 480D and the pair of hard substrates 410a in the Z-axis direction at the negative X-axis end of the wirings 480C and 480D.

The electrical connection between the wirings 480C and 480D and the pair of hard substrates 410b is implemented by the connection part 482b. For example, as illustrated in FIG. 8, two connection parts 482b are provided at the center of the pair of hard substrates 410b in the X-axis direction, and each connects the wirings 480C and 480D and the pair of hard substrates 410b in the Z-axis direction.

The electrical connection between wirings 480C and 480D and the pair of hard substrates 410c is implemented by the connection part 482c. For example, as illustrated in FIG. 8, the connection part 482c connects the wirings 480C and 480D and the pair of hard substrates 410c in the Z-axis direction at the positive X-axis end of the wirings 480C and 480D.

The connection part 482a may implement electrical connection between the wirings 480C and 480D and the pair of hard substrates 410a by any method. The connection part 482a implements electrical connection between the wirings 480C and 480D and the pair of hard substrates 410a by, for example, via connection. Further, the connection part 482a may implement electrical connection between the wirings 480C and 480D and the pair of hard substrates 410a by copper inlay or the like. The same may be applied to the connection parts 482b and 482c.

The wiring 490 includes wirings 490E to 490H as portions provided in the soft substrate 420.

The wiring 490E is provided, among the outer layers of the soft substrate 420, on the outer layer of in the positive Z-axis direction, that is, on the surface of the insulating layer 421B in the positive Z-axis direction between the insulating layers 421A and 421B. The wiring 490E is provided in both the X-axis direction and the Y-axis direction of the outer layer in the positive Z-axis direction of the soft substrate 420 in a range including the entire area of the wirings 480C and 480D. For example, as illustrated in FIG. 8, the wiring 490E is provided in a range from the positive X-axis end to the negative X-axis end in the outer layer in the positive Z-axis direction of the soft substrate 420.

The wiring 490F is provided in the first inner layer of the soft substrate 420. The wiring 490F is arranged in the first inner layer of the soft substrate 420, both between the wiring 480C and the positive X-axis end of the soft substrate 420 and between the wiring 480C and the negative X-axis end of the soft substrate 420. That is, the wiring 490F is arranged to sandwich the wiring 480C in the X-axis direction of the first inner layer of the soft substrate 420. For example, as illustrated in FIG. 8, the wiring 490F is arranged at the positive X-axis end and the negative X-axis end in the first inner layer of the soft substrate 420. Further, the wiring 490F is arranged in the first inner layer of the soft substrate 420 both between the wiring 480C and the positive Y-axis end of the soft substrate 420 and between the wiring 480C and the negative Y-axis end of the soft substrate 420. That is, the wiring 490F is arranged to sandwich the wiring 480C in the Y-axis direction of the first inner layer of the soft substrate 420. For example, as illustrated in FIG. 9 and FIG. 10, the wiring 490F is arranged so that the position of the positive Y-axis end in the Y-axis direction approximately coincides with the position of the positive Y-axis end of the wiring 490E and the wiring 490H in the Y-axis direction. The same may apply to the position of the end in the negative Y-axis direction.

The wiring 490G is provided in the second inner layer of the soft substrate 420. The wiring 490G is arranged in the second inner layer of the soft substrate 420 both between wiring 480D and the positive X-axis end of the soft substrate 420 and between wiring 480D and the negative X-axis end of the soft substrate 420. That is, the wiring 490G is arranged to sandwich the wiring 480D in the X-axis direction of the second inner layer of the soft substrate 420. For example, as illustrated in FIG. 8, the wiring 490G is arranged at the positive X-axis end and the negative X-axis end in the first inner layer of the soft substrate 420, similar to the wiring 490F. Further, the wiring 490G is arranged both between the wiring 480D and the end in the positive Y-axis direction and between the wiring 480D and the end in the negative Y-axis direction in the second inner layer of the soft substrate 420. That is, the wiring 490G is arranged to sandwich the wiring 480D in the Y-axis direction of the second inner layer of the soft substrate 420. For example, as illustrated in FIG. 9 and FIG. 10, the wiring 490G, similar to the wiring 490F, is arranged so that the position of the positive Y-axis end in the Y-axis direction approximately coincides with the position of the positive Y-axis end of the wiring 490E and the wiring 490H in the Y-axis direction. The same may be applied to the position of the end in the negative direction of the Y-axis.

The wiring 490H is provided on the outer layer of the soft substrate 420 in the negative Z-axis direction, that is, on the surface of the insulating layer 421D in the negative Z-axis direction. The wiring 490H, similar to the wiring 490E, is provided in a range including the entire area of the wirings 480C and 480D in both the X-axis direction and the Y-axis direction of the outer layer of the soft substrate 420 in the negative Z-axis direction. For example, as illustrated in FIG. 8, the wiring 490H is provided in the outer layer in the negative Z-axis direction of the soft substrate 420 in a range from the positive X-axis direction end to the negative X-axis direction end. For example, as illustrated in FIG. 9 and FIG. 10, the wiring 490H is arranged so that the end of the wiring 490H in the positive Y-axis direction approximately coincides with the position of the end of the wiring 490E in the positive Y-axis direction. The same may also apply to the position in the negative Y-axis direction.

The electrical connection between the wirings 490E to 490H and the pair of hard substrates 410a is implemented by a connection part 492a. For example, as illustrated in FIG. 10, the connection part 492a connects the wirings 490E to 490H and the pair of hard substrates 410a in the Z-axis direction at the negative X-axis end of wirings 490E and 490H. For example, as illustrated in FIG. 10, the connection part 492a connects the wirings 490E to 490H and the pair of hard substrates 410a in the Z-axis direction at both ends of the wirings 490E and 490H in the positive Y-axis direction and the negative Y-axis direction.

The electrical connection between the wirings 490E and 490H and the pair of hard substrates 410b is implemented by a connection part 492b. For example, as illustrated in FIG. 8, the connection parts 492b are respectively provided at the two ends in the X-axis direction of the pair of hard substrates 410b, and connect the wirings 490E to 490H and the pair of hard substrates 410b in the Z-axis direction. For example, as illustrated in FIG. 10, the connection part 492b connects the wirings 490E to 490H and the pair of hard substrates 410b in the Z-axis direction at both ends of the wirings 490E and 490H in the positive Y-axis direction and the negative Y-axis direction.

The electrical connection between the wirings 490E to 490H and the pair of hard substrates 410c is implemented by a connection part 492c. For example, as illustrated in FIG. 8, the connection part 492c connects the wirings 490E to 490H and the pair of hard substrates 410c in the Z-axis direction at the positive X-axis end of the wirings 490E and 490H. For example, as illustrated in FIG. 10, the connection part 492c connects the wirings 490E to 490H and the pair of hard substrates 410c in the Z-axis direction at both ends of the wirings 490E and 490H in the positive Y-axis direction and the negative Y-axis direction.

The connection part 492a may implement electrical connection between the wirings 490E to 490H and the pair of hard substrates 410a by any method. The connection part 492a implements electrical connection between the wirings 490E to 490D and the pair of hard substrates 410a by, for example, via connection. Further, the connection part 492a may implement the electrical connection between the wirings 490E to 490H and the pair of hard substrates 410a by copper inlay or the like. The same may be applied to the connection parts 492b and 492c.

Thus, in this example, the wiring 480 is arranged to be sandwiched between the wirings 490F and 490G in the X-axis direction and the Y-axis direction, and between the wirings 490E and 490H in the Z-axis direction. Thus, the wiring 480 can be arranged so as to be surrounded by the wiring 490 in the soft substrate 420. Therefore, the wiring 480 is electromagnetically shielded by the wiring 490, and as a result, the parasitic inductance component of the wiring 490 (the wirings 490E to 490H) of the soft substrate 420 can be prevented (canceled) Therefore, the gate oscillation phenomenon caused by the parasitic component of the wirings 480 and 490 and the imbalance of the current flowing through the semiconductor switch element SW can be prevented, and the wiring board 400 with higher reliability and operation stability can be implemented.

Fifth Example of Wiring Board

Next, the wiring board 400 according to the present embodiment will be described with reference to FIGS. 11 to 13.

The following discussion is focused on the different parts from the above first to fourth examples, and the same or corresponding content as the above first to fourth examples be omitted. Further, in this example, the circuit diagram of the power conversion apparatus 1 including the wiring board 400, the perspective view of the wiring board 400, and the top view of the wiring board 400 are the same as those in the first example described above, so the illustrations are omitted, and the explanation is made by referring to FIGS. 1 to 3 of the first example described above.

Figure 11:
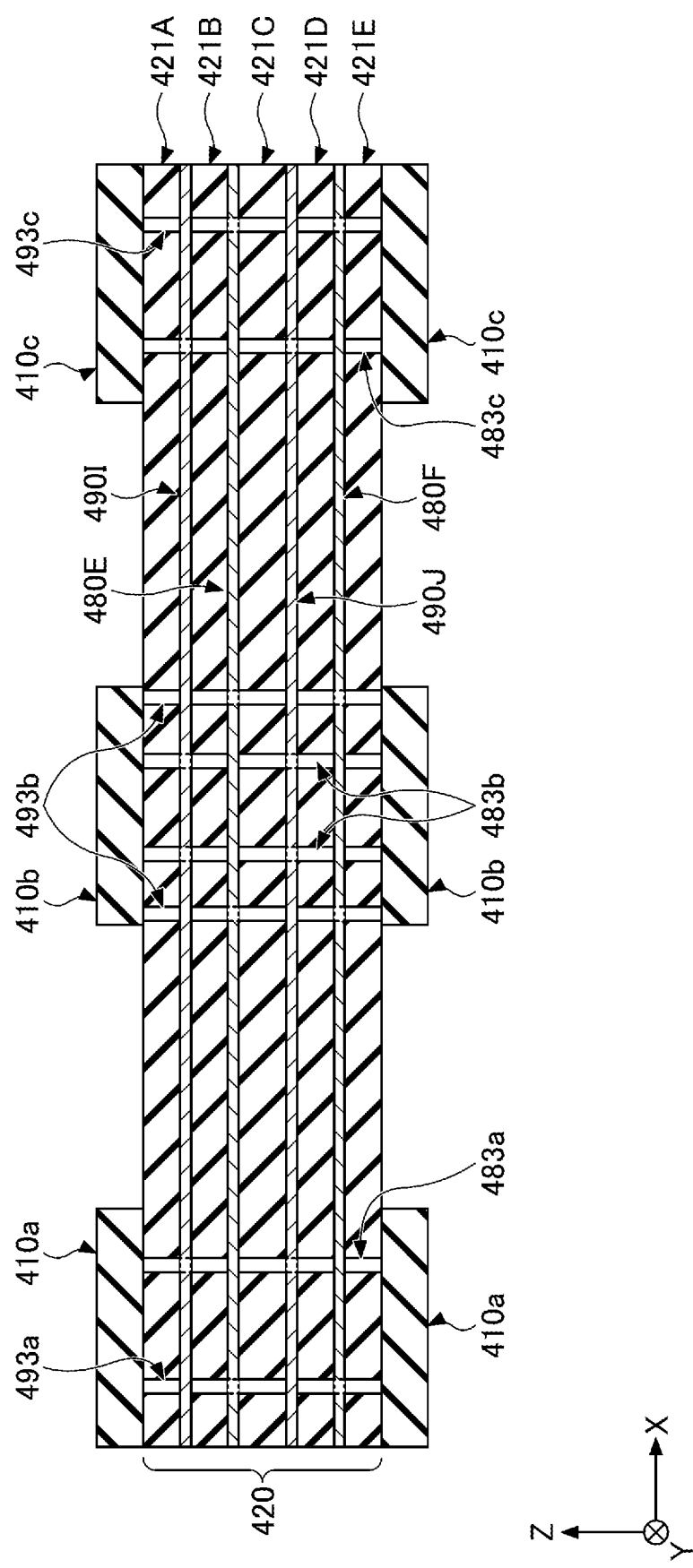
FIG. 11 is a cross-sectional view illustrating a fifth example of a wiring board.
Figure 12:
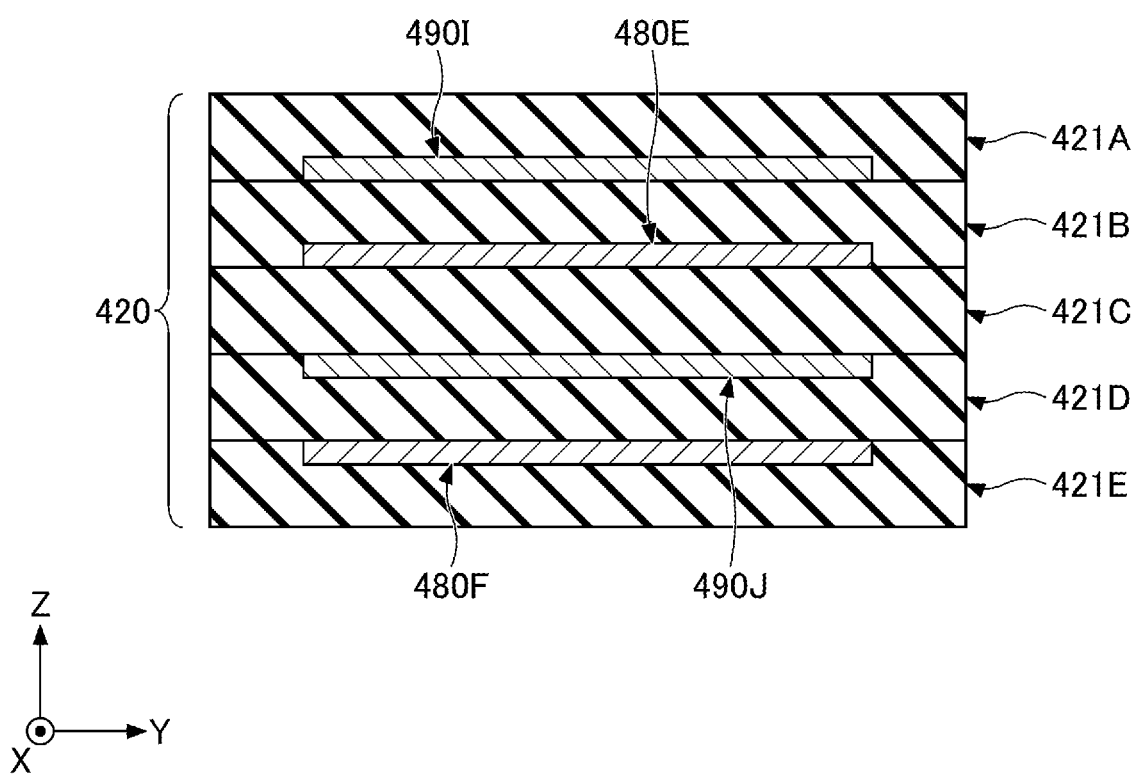
FIG. 12 is a cross-sectional view illustrating the fifth example of a wiring board.
Figure 13:
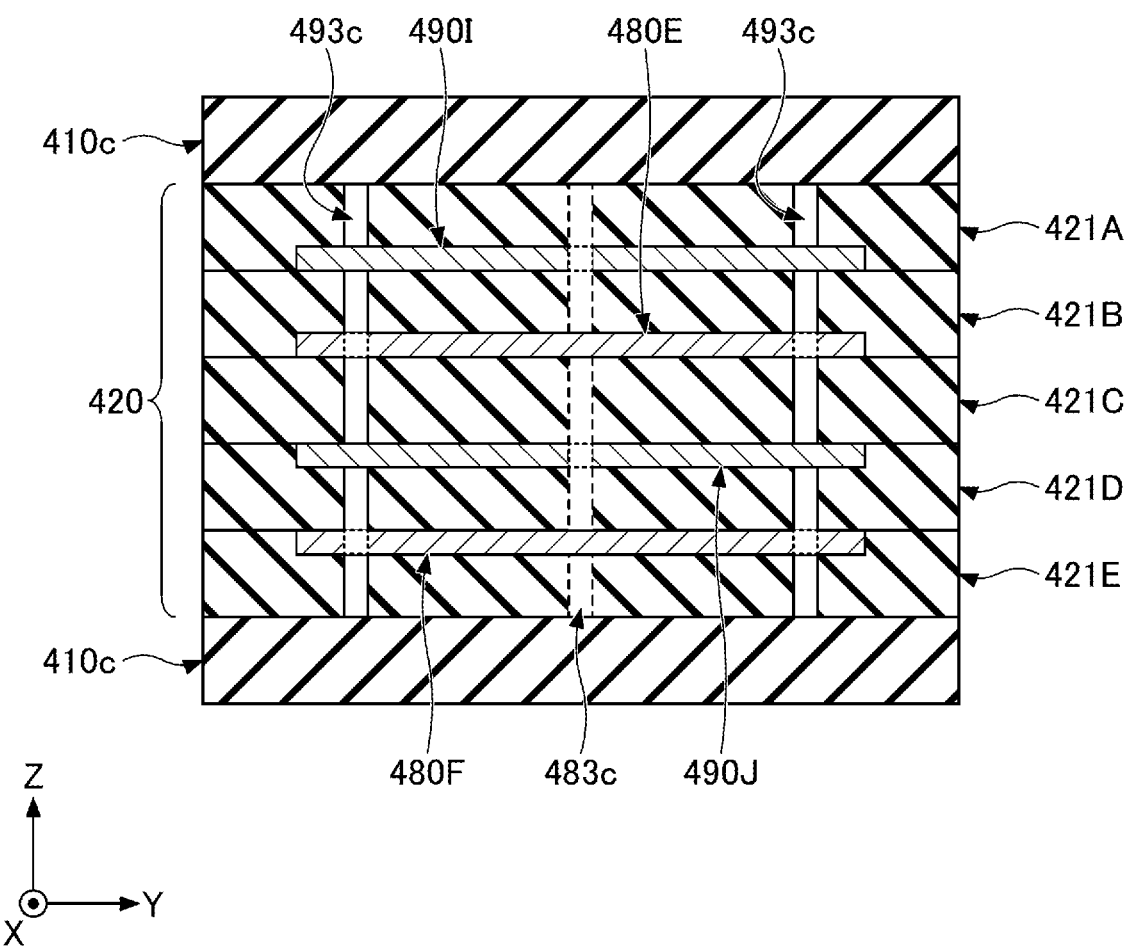
FIG. 13 is a cross-sectional view illustrating the fifth example of a wiring board.

FIGS. 11 to 13 are cross-sectional views illustrating the fourth example of the wiring board 400. Specifically, FIGS. 11 to 13 are cross-sectional views of lines A-A', B-B' and C-C' in FIG. 2.

A cross-sectional view in a plane parallel to the Y-axis and Z-axis of the soft substrate 420 at a point between the pair of hard substrates 410a and the pair of hard substrates 410b in the X-axis direction would be illustrated in the same manner as in FIG. 12, and therefore, the illustration is omitted. Further, a cross-sectional view in a plane parallel to the Y-axis and Z-axis of the wiring board 400 at a point where the soft substrate 420 is sandwiched by the two hard substrates 410a would be illustrated in the same manner as in FIG. 13, and therefore, the illustration is omitted. Specifically, this would be illustrated by a diagram in which a pair of hard substrates 410c, a connection part 483c, and a connection part 493c in FIG. 13 are each replaced by a pair of hard substrates 410a, a connection part 483a, and a connection part 493a. Further, a cross-sectional view in a plane parallel to the Y and Z axes of the wiring board 400 at a point where the soft substrate 420 is sandwiched by two hard substrates 410b would be illustrated in the same manner as in FIG. 13, and therefore, the illustration is omitted. Specifically, this would be illustrated by a diagram in which the pair of hard substrates 410c, the connection part 483c, and the connection part 493c in FIG. 13 are each replaced by a pair of hard substrates 410b, a connection part 483b, and a connection part 493b.

As illustrated in FIG. 11 to FIG. 13, the soft substrate 420 includes the insulating layers 421A to 421E, as in the case of the fourth example above, and four stacked wiring layers are provided.

In this example, the wiring 480 includes wirings 480E and 480F as a part provided on the soft substrate 420.

The wiring 480E is provided on the first inner layer of the soft substrate 420, i.e., on the surface of the insulating layer 421C between the insulating layers 421B and 421C. For example, as illustrated in FIG. 11, the wiring 480E is provided in a range from the positive X-axis end to the negative X-axis end of the soft substrate 420, in the first inner layer of the soft substrate 420. Further, as illustrated in FIG. 12 and FIG. 13, the wiring 480E is arranged in the center of the Y-axis direction in the first inner layer of the soft substrate 420 so that both ends of the Y-axis positive direction and the Y-axis negative direction are inside the both ends of the soft substrate 420.

The wiring 480F is provided on the outer layer of the soft substrate 420 in the negative X-axis direction, that is, on the surface of the insulating layer 421D between the insulating layers 421D and 421E in the negative Z-axis direction. For example, as illustrated in FIG. 11, the wiring 480F is provided in the outer layer of the soft substrate 420 in the negative X-axis direction in a range from the positive X-axis end to the negative X-axis end of the soft substrate 420. As illustrated in FIG. 12 and FIG. 13, the wiring 480F is arranged in the middle of the Y-axis direction in the outer layer of the soft substrate 420 in the negative X-axis direction, so that both ends of the positive Y-axis direction and the negative Y-axis direction are inside the both ends of the soft substrate 420. The wiring 480F may be arranged so that the positions of both ends in the positive Y-axis direction and the negative Y-axis direction approximately coincide with the wiring 480E.

The electrical connection between the wirings 480E and 480F and the pair of hard substrates 410a is implemented by a connection part 483a. For example, as illustrated in FIG. 11 and FIG. 13, the connection parts 483a are provided at the center in the Y-axis direction and toward the positive X-axis direction than the center in the X-axis direction of the pair of hard substrates 410a, and each connects the wirings 480E and 480F and the pair of hard substrates 410a in the Z-axis direction.

The electrical connection between wirings 480E and 480F and the pair of hard substrates 410b is implemented by a connection part 483b. For example, as illustrated in FIG. 11 and FIG. 13, two connection parts 483b are provided in the X-axis direction at the center of the Y-axis direction of the pair of hard substrates 410b, and each connects the wirings 480E and 480F and the pair of hard substrates 410b in the Z-axis direction.

The electrical connection between wirings 480E and 480F and the pair of hard substrates 410c is implemented by a connection part 483c. For example, as illustrated in FIG. 11 and FIG. 13, the connection parts 483c are provided at the center in the Y-axis direction and toward the negative X-axis direction than the center in the X-axis direction of the pair of hard substrates 410c, and each connects the wirings 480E and 480F and the pair of hard substrates 410c in the Z-axis direction.

The connection part 483a may achieve electrical connection between the wirings 480E and 480F and the pair of hard substrates 410a by any method. The connection part 483a implements the electrical connection between the wirings 480E and 480F and the pair of hard substrates 410a by, for example, via connection. Further, the connection part 483a may implement an electrical connection between the wirings 480E and 480F and the pair of hard substrates 410a by copper inlay or the like. The same may be applied to the connection parts 483b and 483c.

In this example, the wiring 490 includes wirings 490I and 490J as a portion provided on the soft substrate 420.

The wiring 490I is provided on the outer layer of the soft substrate 420 in the positive X-axis direction, that is, on the surface of the insulating layer 421B in the positive Z-axis direction between the insulating layers 421A and 421B. For example, as illustrated in FIG. 11, the wiring 490I is provided in the outer layer of the soft substrate 420 in the positive X-axis direction in a range from the positive X-axis direction end to the negative X-axis direction end of the soft substrate 420. For example, as illustrated in FIG. 12 and FIG. 13, the wiring 490I is arranged in the middle of the Y-axis direction in the outer layer of the soft substrate 420 in the positive X-axis direction so that both ends of the positive Y-axis direction and the negative Y-axis direction are inside the both ends of the soft substrate 420. The wiring 490I may be arranged so that the positions of both ends in the positive Y-axis direction and the negative Y-axis direction approximately coincide with the wirings 480E and 480F.

The wiring 490J is provided on the second inner layer of the soft substrate 420, that is, on the surface of the insulating layer 421C in the negative Z-axis direction between the insulating layers 421C and 421D. For example, as illustrated in FIG. 11, in the second inner layer of the soft substrate 420, the wiring 490J is provided in the range from the positive X-axis end to the negative X-axis end of the soft substrate 420. For example, as illustrated in FIG. 12 and FIG. 13, in the second inner layer of the soft substrate 420, the wiring 490J is arranged in the center of the Y-axis direction so that both ends of the positive and negative Y-axis directions are inside the both ends of the soft substrate 420. The wiring 490I may be arranged so that the positions of both ends in the positive Y-axis direction and the negative Y-axis direction approximately coincide with the wirings 480E and 480F.

The electrical connection between the wirings 490I and 490J and the pair of hard substrates 410a is implemented by a connection part 493a. For example, as illustrated in FIG. 11 and FIG. 13, the connection parts 493a are provided at both ends of the wirings 490I and 490J in the Y-axis direction and toward the negative X-axis direction than the center of the pair of hard substrates 410a in the X-axis direction, and each connects the wirings 490I to 490J and the pair of hard substrates 410a in the Z-axis direction.

The electrical connection between the wirings 490I and 490J and the pair of hard substrates 410b is implemented by a connection part 493b. For example, as illustrated in FIG. 11, the connection parts 493b are provided at both ends of the pair of hard substrates 410b in the X-axis direction, and each connects the wirings 490I and 490J and the pair of hard substrates 410b in the Z-axis direction. For example, as illustrated in FIG. 13, the connection parts 493b are provided at both ends of the wirings 490I and 490J in the Y-axis direction, and each connects the wirings 490I and 490J and the pair of hard substrates 410b in the Z-axis direction.

The electrical connection between the wirings 490I to 490J and the pair of hard substrates 410c is implemented by the connection part 493c. For example, as illustrated in FIG. 11 and FIG. 13, the connection part 493c is provided at both ends of the wirings 490I and 490J in the Y-axis direction and toward the positive X-axis direction than the center of the pair of hard substrates 410c in the X-axis direction, and connects the wirings 490I to 490J and the pair of hard substrates 410c in the Z-axis direction.

The connection part 493a may achieve electrical connection between the wirings 490I and 490J and the pair of hard substrates 410a by any method. The connection part 493a implements electrical connection between the wirings 490I and 490D and the pair of hard substrates 410a by, for example, via connection. Further, the connection part 493a may implement an electrical connection between the wirings 490I and 490J and the pair of hard substrates 410a by copper inlay or the like. The same may be applied to the connection parts 493b and 493c.

In this way, the wirings 480 and 490 are alternately arranged in the Z-axis direction, that is, in the stacking direction of the wiring layers, in the soft substrate 420. Thus, a part of the parasitic inductance component of the wirings 480 and 490 can be canceled. Therefore, the inductance per unit wiring length of the wirings 480 and 490 can be reduced. Therefore, the gate oscillation phenomenon caused by the parasitic component of the wirings 480 and 490 and the imbalance of the current flowing through the semiconductor switch element SW can be prevented, and the wiring board 400 with higher reliability and operation stability can be implemented.

Sixth Example of Wiring Board

Next, a sixth example of the wiring board 400 according to the present embodiment will be described with reference to FIG. 14.

The following discussion will focus on the parts that differ from the first to fifth examples above, and the same or corresponding content as the first to fifth examples above may be omitted.

Figure 14:
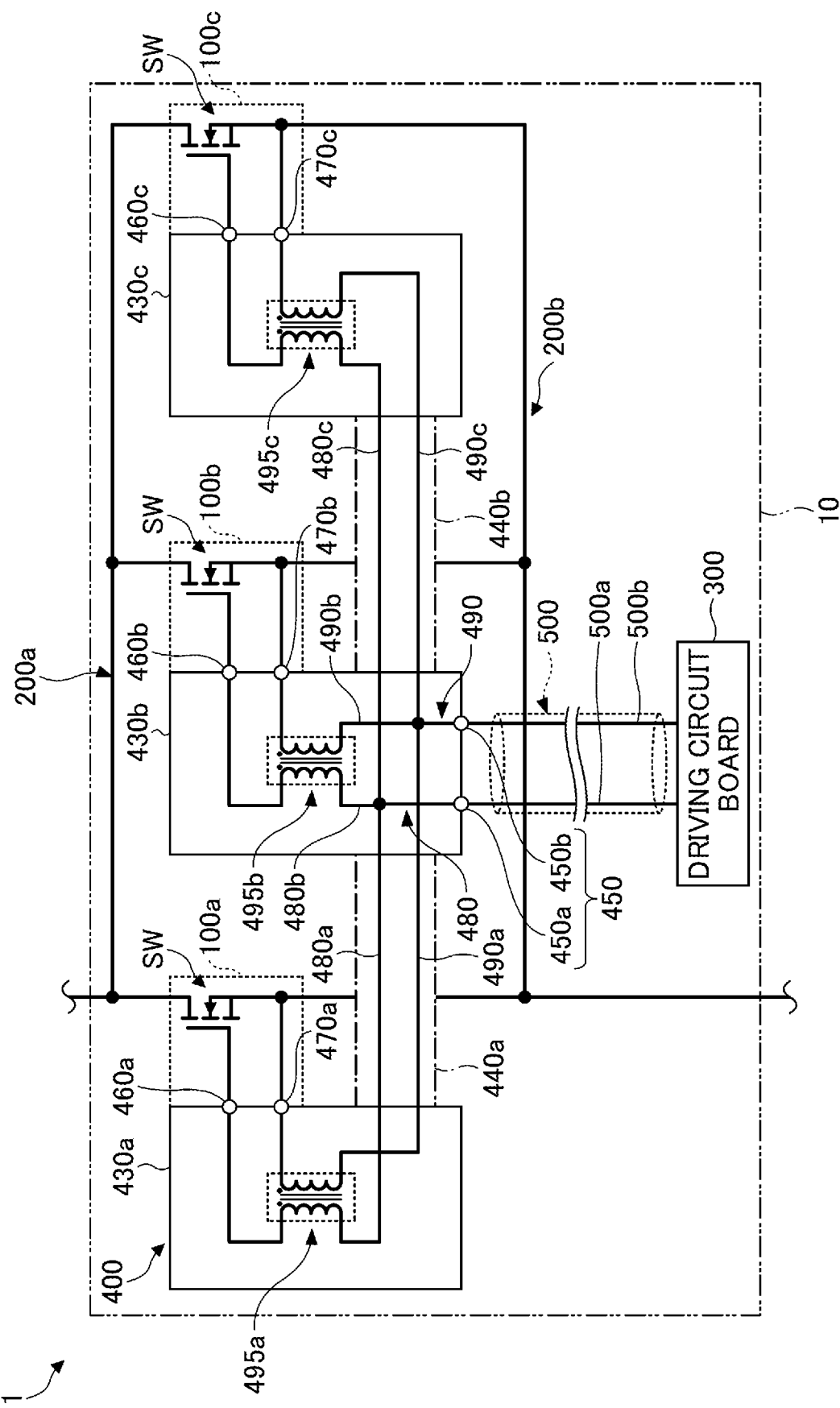
FIG. 14 is a circuit diagram illustrating one example of a power conversion apparatus including a sixth example of a wiring board.

FIG. 14 is a circuit diagram illustrating an example of the power conversion apparatus 1 including a sixth example of the wiring board 400.

In FIG. 14, unlike FIGS. 1 and 4, the main circuit is omitted and only the arm part 10 is drawn. The same applies to FIGS. 15 to 18 below.

As illustrated in FIG. 14, this example differs from the above second example in that common-mode choke coils 495a to 495c are added, and is otherwise the same as the above second example.

The wiring board 400 includes the common-mode choke coils 495a to 495c.

The common-mode choke coil 495a is provided to straddle the wiring 480a connecting between the electrodes 450a and 460a and the wiring 490a connecting between the electrodes 450b and 470a. Specifically, the coil on the primary-side of the common-mode choke coil 495a is arranged in the form of being inserted into the wiring 480a, and the coil on the secondary-side of the common-mode choke coil 495a is arranged in the form of being inserted into the wiring 490a. For example, as illustrated in FIG. 14, the common-mode choke coil 495a is arranged on the hard substrate 430a.

The common-mode choke coil 495b is provided to straddle the wiring 480b connecting between the electrodes 450a and 460b and the wiring 490b connecting between the electrodes 450b and 470b. Specifically, the coil on the primary-side of the common-mode choke coil 495b is arranged on the wiring 480b, and the coil on the secondary-side of the common-mode choke coil 495b is arranged on the wiring 490b. For example, as illustrated in FIG. 14, the common-mode choke coil 495b is arranged on the hard substrate 430b.

The common-mode choke coil 495c is provided to straddle the wiring 480c connecting between the electrodes 450a and 460c and the wiring 490c connecting between the electrodes 450b and 470c. More specifically, a coil on the primary-side of the common-mode choke coil 495c is arranged on the wiring 480c, and a coil on the secondary-side of the common-mode choke coil 495c is arranged on the wiring 490c. For example, as illustrated in FIG. 14, the common-mode choke coil 495c is arranged on a hard substrate 430c.

Thus, in this example, the common-mode choke coils 495a to 495c are provided so as to straddle the wirings 480 the 490. Thus, by reducing the common-mode current between the semiconductor modules 100a to 100c, the cross current (circulating current) of the wirings 480 and 490 caused by the variation in the characteristics of the semiconductor switch element SW for each of the semiconductor modules 100a to 100c can be reduced. Therefore, it is possible to reduce the gate oscillation phenomenon and the current imbalance and the like for each of the semiconductor modules 100a to 100c, while mitigating the degradation of the switching performance of the semiconductor switch element SW. Therefore, the wiring board 400 with higher reliability and operation stability can be implemented.

Seventh Example of Wiring Board

Next, a seventh example of the wiring board 400 according to the present embodiment will be described with reference to FIG. 15.

The following discussion will focus on the parts that differ from first to sixth examples, and the same or corresponding content as the first to sixth examples above may be omitted.

Figure 15:
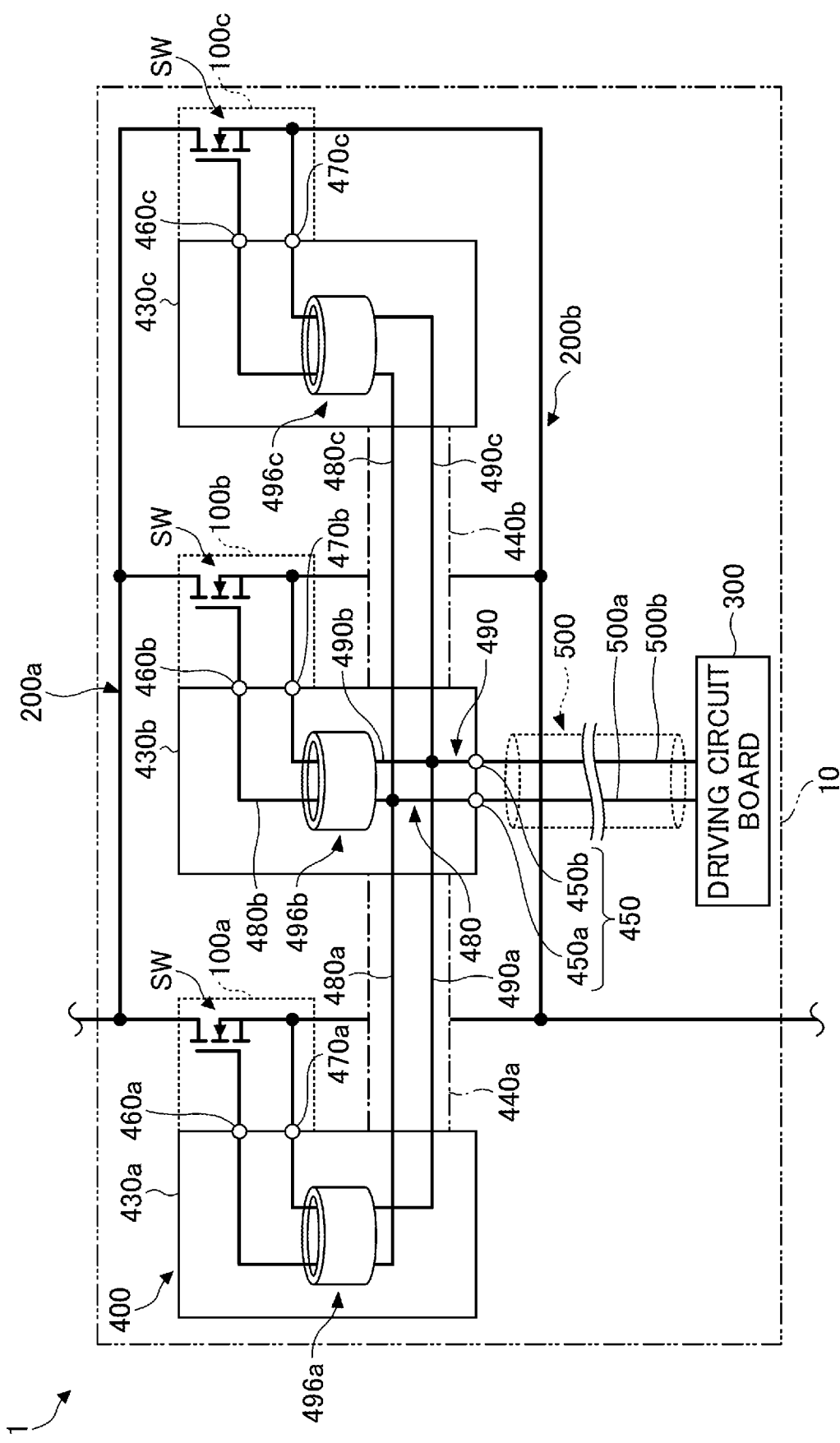
FIG. 15 is a circuit diagram illustrating one example of a power conversion apparatus including a seventh example of a wiring board.

FIG. 15 is a circuit diagram illustrating an example of the power conversion apparatus 1 including a seventh example of the wiring board 400.

As illustrated in FIG. 15, this example differs from the above second example in that magnetic cores 496a to 496c are added, and is otherwise the same as the above second example.

The wiring board 400 includes the magnetic cores 496a to 496c (an example of a magnetic core for common-mode choke).

For example, as illustrated in FIG. 15, the magnetic core 496a has an approximately annular shape and is provided to enclose the wiring 480a connecting between the electrodes 450a and 460a and the wiring 490a connecting between the electrodes 450b and 470a. For example, as illustrated in FIG. 15, the magnetic core 496a is arranged on the hard substrate 430a.

For example, as illustrated in FIG. 15, the magnetic core 496b has an approximately annular shape and is provided to enclose the wiring 480b connecting between the electrodes 450a and 460b and the wiring 490b connecting between electrodes 450b and 470b. For example, as illustrated in FIG. 15, the magnetic core 496b is arranged on the hard substrate 430b.

For example, as illustrated in FIG. 15, the magnetic core 496c has an approximately annular shape and is provided to surround the wiring 480c connecting between the electrodes 450a and 460c and the wiring 490c connecting between the electrodes 450b and 470c. For example, as illustrated in FIG. 15, the magnetic core 496c is arranged on the hard substrate 430c.

The magnetic cores 496a to 496c may be configured as one unit or in a divisible form from the viewpoint of ensuring mechanical strength and mountability on the wiring board 400.

Thus, in this example, the magnetic cores 496a to 496c are provided to surround the wirings 480 and 490. Thus, similar to the common-mode choke coils 495a to 495c of the sixth example above, the common mode current can be prevented, and as a result, the cross current (circulating current) of the wirings 480 and 490 caused by the variation in the characteristics of the semiconductor switch element SW for each of the semiconductor modules 100a to 100c can be reduced. Therefore, it is possible to prevent the gate oscillation phenomenon and the current imbalance and the like for each of the semiconductor modules 100a to 100c, while mitigating the degradation of the switching performance of the semiconductor switch element SW. Therefore, the wiring board 400 with higher reliability and operation stability can be implemented.

Eighth Example of Wiring Board

Next, an eighth example of the wiring board 400 according to the present embodiment will be described with reference to FIG. 16.

The following discussion will focus on the parts that differ from the first to seventh examples above, and the same or corresponding content as the first to seventh examples above may be omitted.

Figure 16:
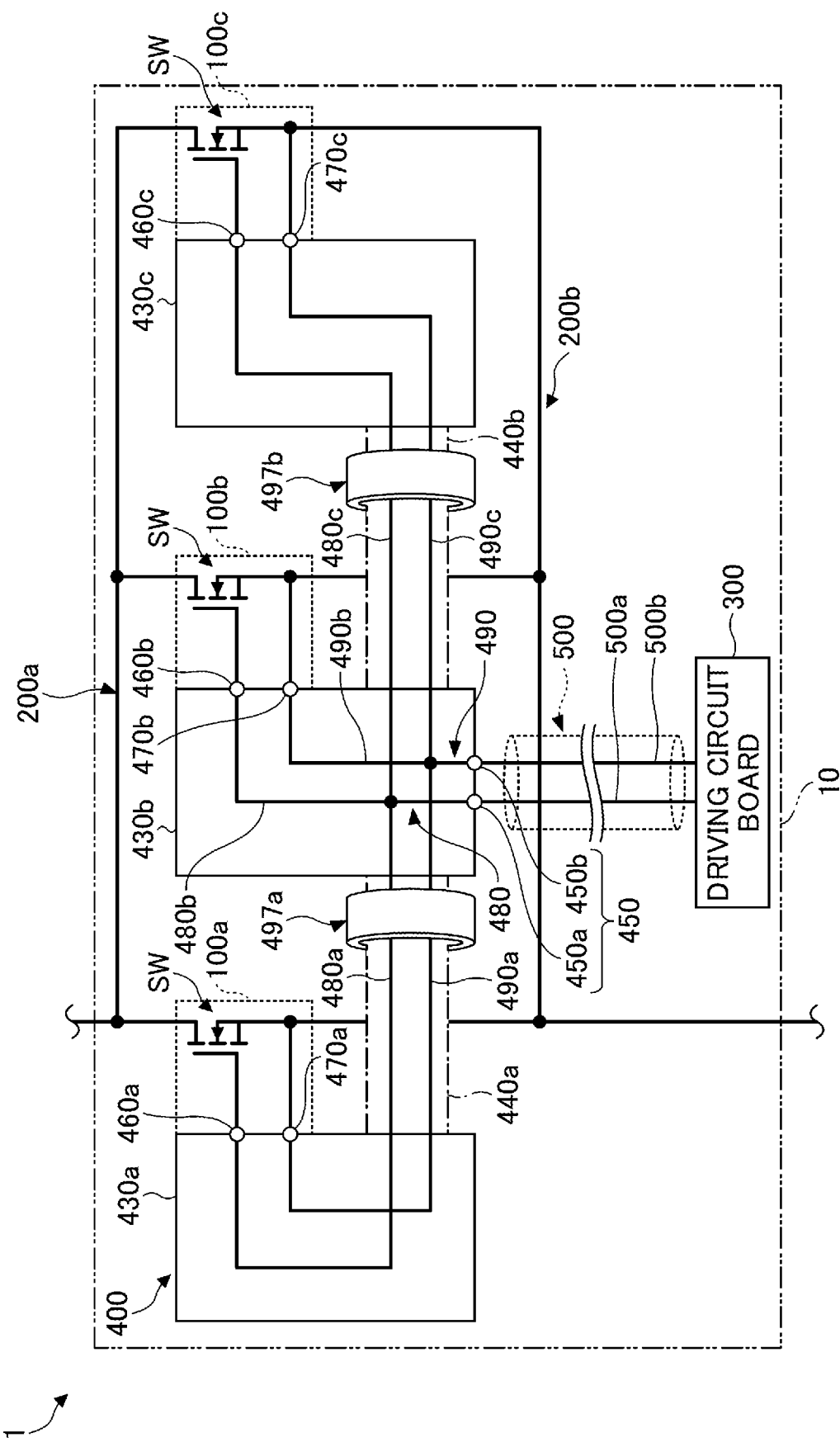
FIG. 16 is a circuit diagram illustrating one example of a power conversion apparatus including an eighth example of a wiring board.

FIG. 16 is a circuit diagram illustrating an example of the power conversion apparatus 1 including an eighth example of the wiring board 400.

As illustrated in FIG. 16, this example differs from the above second example in that magnetic cores 497a and 497b are added, and is otherwise the same as the above second example.

The wiring board 400 includes the magnetic cores 497a and 497b (an example of a magnetic core for common-mode choke).

For example, as illustrated in FIG. 16, the magnetic core 497a has an approximately annular shape and is provided to surround the soft substrate 440a on which the wiring 480 (the wiring 480a) and the wiring 490 (the wiring 490a) are arranged. The magnetic core 497a is held and fixed to at least one of, for example, the hard substrate 430a and the hard substrate 430b. Any configuration may be adopted for the holding mechanism (fixing mechanism) between the magnetic core 497a and the hard substrates 430a and 430b. For example, a cutout is provided in the magnetic core 497a and the magnetic core 497a is held and fixed in such a way that and the hard substrates 430a and 430b are inserted in the cutout.

Part of the wirings 480b and 490b may be arranged on the soft substrate 440a.

For example, as illustrated in FIG. 16, the magnetic core 497b has an approximately annular shape and is provided to surround the soft substrate 440a on which the wiring 480 (the wiring 480c) and the wiring 490 (the wiring 490c) are arranged. The magnetic core 497b is held and fixed to at least one of, for example, the hard substrate 430b and the hard substrate 430c. Any configuration may be adopted for the holding mechanism (fixing mechanism) between the magnetic core 497a and the hard substrates 430b and 430c. For example, a cutout is provided in the magnetic core 497b and the magnetic core 497b is held and fixed in such a way that and the hard substrates 430b and 430c are inserted in the cutout.

Part of the wirings 480b and 490b may be arranged on the soft substrate 440b.

The magnetic cores 497a and 497b may be configured as one body or in a dividable form, similar to the magnetic cores 496a to 496c in the seventh example above.

Thus, in this example, the magnetic cores 497a and 497b are provided to surround the soft substrates 440a and 440b on which the wirings 480 and 490 are provided. Thus, as in the cases of the sixth and seventh examples above, the common-mode current can be prevented, and as a result, the cross current (circulating current) in the wirings 480 and 490 caused by the variation in the characteristics of the semiconductor switch element SW can be reduced for each of the semiconductor modules 100a to 100c. Therefore, it is possible to prevent the gate oscillation phenomenon and the current imbalance and the like for each of the semiconductor modules 100a to 100c, while mitigating the degradation of the switching performance of the semiconductor switch element SW. Therefore, the wiring board 400 with higher reliability and operation stability can be implemented.

Ninth Example of Wiring Board

Next, a ninth example of the wiring board 400 according to the present embodiment will be described with reference to FIG. 17.

The following discussion will focus on the parts that differ from the first to eighth examples above, and the same or corresponding content as the first to eighth examples above may be omitted.

Figure 17:
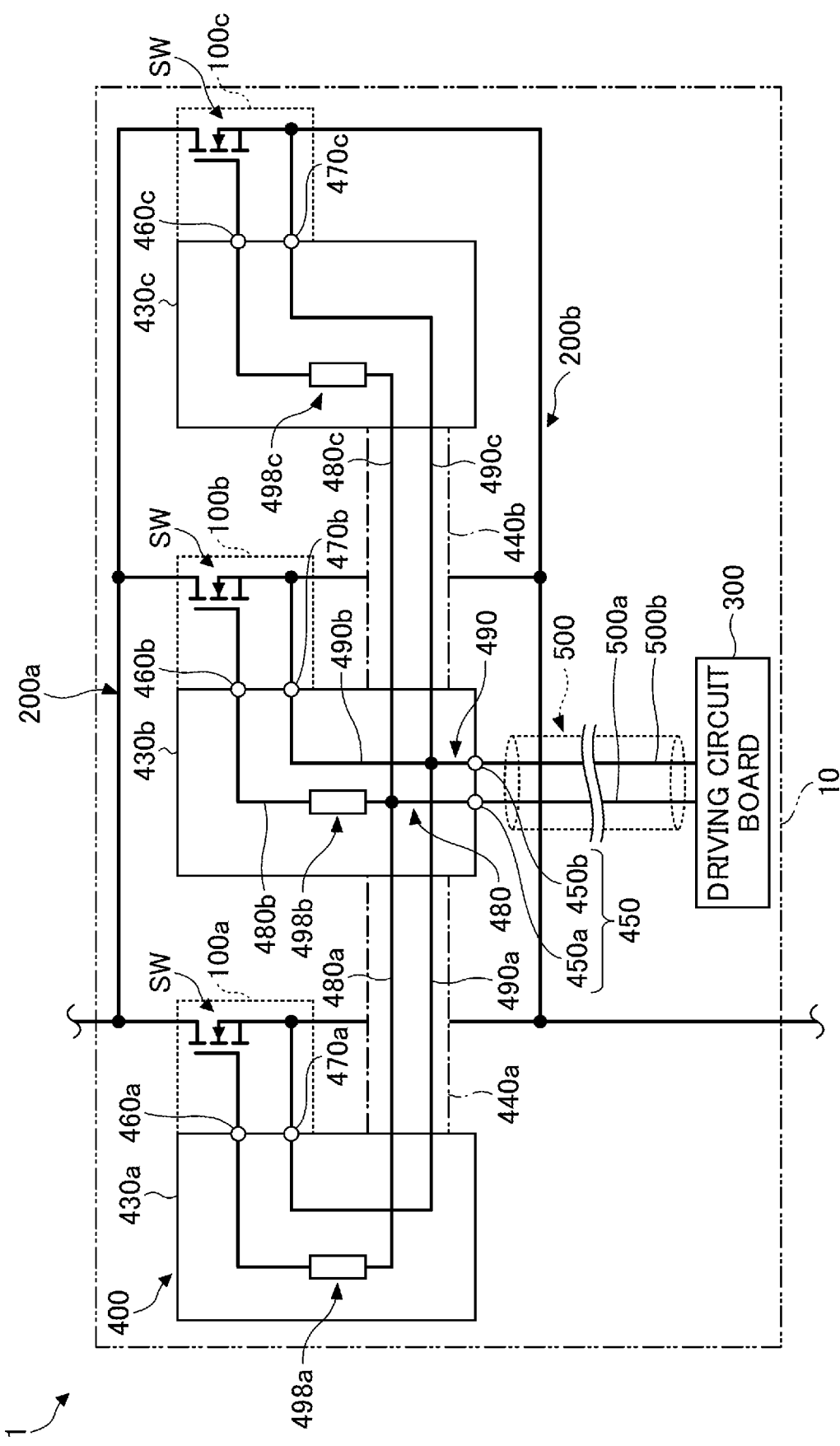
FIG. 17 is a circuit diagram illustrating one example of a power conversion apparatus including a ninth example of a wiring board.

FIG. 17 is a circuit diagram illustrating an example of the power conversion apparatus 1 including a ninth example of the wiring board 400.

As illustrated in FIG. 17, this example differs from the second example above in that resistors 498a to 498c are added, and is otherwise the same as the second example above.

The wiring board 400 includes the resistors 498a to 498c (an example of the first resistor).

The resistor 498a is arranged in such a way as to be is inserted into the wiring 480a connecting between the electrodes 450a and 460a. For example, as illustrated in FIG. 17, the resistor 498a is arranged on the hard substrate 430a.

The resistor 498b is arranged in such a way as to be inserted into the wiring 480b connecting between the electrodes 450a and 460b. For example, as illustrated in FIG. 17, the resistor 498b is arranged on the hard substrate 430b.

The resistor 498c is arranged in such a way as to be inserted into the wiring 480c connecting between the electrodes 450a and 460c. For example, as illustrated in FIG. 17, the resistor 498c is arranged on the hard substrate 430c.

The resistance values of the resistors 498a to 498c are set appropriately and may be approximately the same as each other, or at least some of these values may be different.

Thus, in this example, the resistors 498a to 498c are arranged on the wiring 480. This can prevent a current imbalance caused by variations and the like in the characteristics of the semiconductor switch elements SW for each of the semiconductor modules 100a to 100c. When the current imbalance is negligible, the cross current (circulating current) between the semiconductor modules 100a to 100c can be reduced. This is particularly suitable when it is not possible to secure space for mounting the magnetic cores 496a to 496c of the seventh example and the magnetic cores 497a and 497b of the eight example.

Tenth Example of Wiring Board

Next, a tenth example of the wiring board 400 according to the present embodiment will be described with reference to FIG. 18.

The following discussion will focus on the parts that differ from the first to ninth examples above, and the same or corresponding content as the first to ninth examples above may be omitted.

Figure 18:
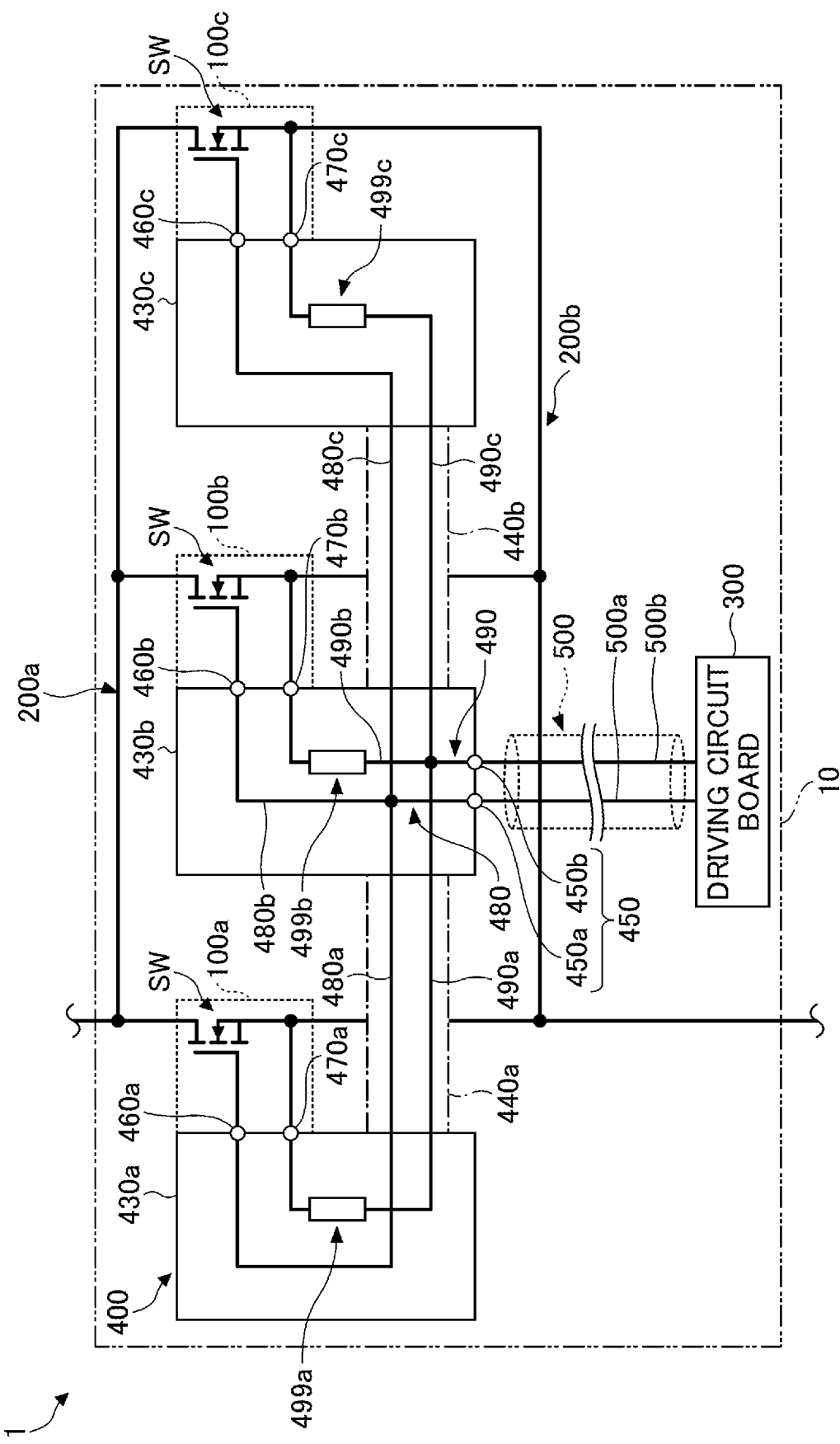
FIG. 18 is a circuit diagram of a power conversion apparatus including a tenth example of a wiring board.

FIG. 18 is a circuit diagram illustrating one example of the power conversion apparatus 1 including the tenth example of the wiring board 400.

As illustrated in FIG. 18, this example differs from the second example above in that resistors 499a to 499c are added, and is otherwise the same as the second example above.

The wiring board 400 includes the resistors 499a to 499c (an example of a second resistor).

The resistor 499a is arranged in such a way as to be inserted into the wiring 490a connecting between the electrodes 450b and 470a. For example, as illustrated in FIG. 18, the resistor 499a is arranged on the hard substrate 430a.

The resistor 499b is arranged in such a way as to be inserted into the wiring 490b connecting between the electrodes 450b and 470b. For example, as illustrated in FIG. 18, the resistor 499b is arranged on the hard substrate 430b.

The resistor 499c is arranged in such a way as to be inserted into the wiring 490c connecting between the electrodes 450b and 470c. For example, as illustrated in FIG. 18, the resistor 499c is arranged on the hard substrate 430c.

The resistance values of the resistors 499a to 499c are set appropriately and may be approximately the same as each other, or at least some of these values may be different.

Thus, in this example, the resistors 499a to 499c are arranged on the wiring 490. This can prevent the current imbalance caused by variations and the like in the characteristics of the semiconductor switch elements SW for each of the semiconductor modules 100a to 100c. When the current imbalance is negligible, the cross current (circulating current) between the semiconductor modules 100a to 100c can be prevented. This is particularly suitable when it is not possible to secure space for mounting the magnetic cores 496a to 496c of the seventh example and the magnetic cores 497a and 497b of the eight example.

Eleventh Example of Wiring Board

Next, an eleventh example of the wiring board according to the present embodiment will be described.

In this example, the circuit diagram of the power conversion apparatus 1 including the wiring board 400 is the same as in the first example described above, so the illustration is omitted and the explanation is given by referring to FIG. 1.

This example differs from the above first example in that the structures of the electrode 450 and the electric circuit 500 are specified, and is otherwise the same as the above example 1.

In this example, a coaxial connector is used to connect the wiring 480 and the wiring 490 to the electric circuit 500. The coaxial connector is, for example, a BNC connector. For example, the electrode 450 connected to the wirings 480 and 490 is a jack (female) of the coaxial connector, and the tip connected to the electrode 450 of the electrical circuit 500 is a plug (male) of the coaxial connector. With this, the plug of the coaxial connector at the tip of the electric circuit 500 can be inserted into the jack of the coaxial connector corresponding to the electrode 450, and the wiring 480 and the wiring 490 can be connected to the electric circuit 500.

Specifically, the wiring 480 is connected to the electric circuit main body (internal conductor) at the center of the coaxial connector (jack), and the wiring 490 is connected to the external conductor surrounding the electric circuit main body of the coaxial connector (jack). That is, the electric circuit main body (internal conductor) at the center of the coaxial connector (jack) as the electrode 450 corresponds to the electrode 450a, and the external conductor of the coaxial connector (jack) as the electrode 450 corresponds to the electrode 450b.

The electric circuit 500 has a coaxial structure including an electric circuit main body at the center (inner conductor) and an outer conductor surrounding the electric circuit main body. That is, the electric circuit main body at the center corresponds to the electric circuit 500a, and the external conductor surrounding the electric circuit main body corresponds to the electric circuit 500b. The electric circuit 500 is, for example, a coaxial cable.

Thus, in this example, a coaxial structure is adopted for the electrode 450 and the electric circuit 500. In this example, the electric circuit 500 and the wirings 480 and 490 may be connected to each other via a coaxial connector. Specifically, the electric circuit 500a, which is the electric circuit main body of the electric circuit 500, and the wiring 480 connected to the electric circuit main body of the coaxial connector including the electrode 450a are connected; and the electric circuit 500b, which is the external conductor of the electric circuit 500, and the wiring 490 connected to the external conductor of the coaxial connector including the electrode 450b are connected. As a result, the parasitic inductance component of the electrode 450 and the electric circuit 500 in the wiring path from the driving circuit of the driving circuit board 300 to the respective semiconductor switch elements SW of the semiconductor modules 100a to 100c can be reduced. Therefore, as in the cases of the third and fourth examples above, the wiring board 400 with higher reliability and operation stability can be implemented.

Twelfth Example of Wiring Board

Next, a twelfth example of the wiring board 400 will be described with reference to FIGS. 19 and 20.

The following discussion will focus on the parts that are different from those of the first to tenth examples above, and the same or corresponding descriptions as those of the first to tenth examples above may be omitted.

Figure 19:
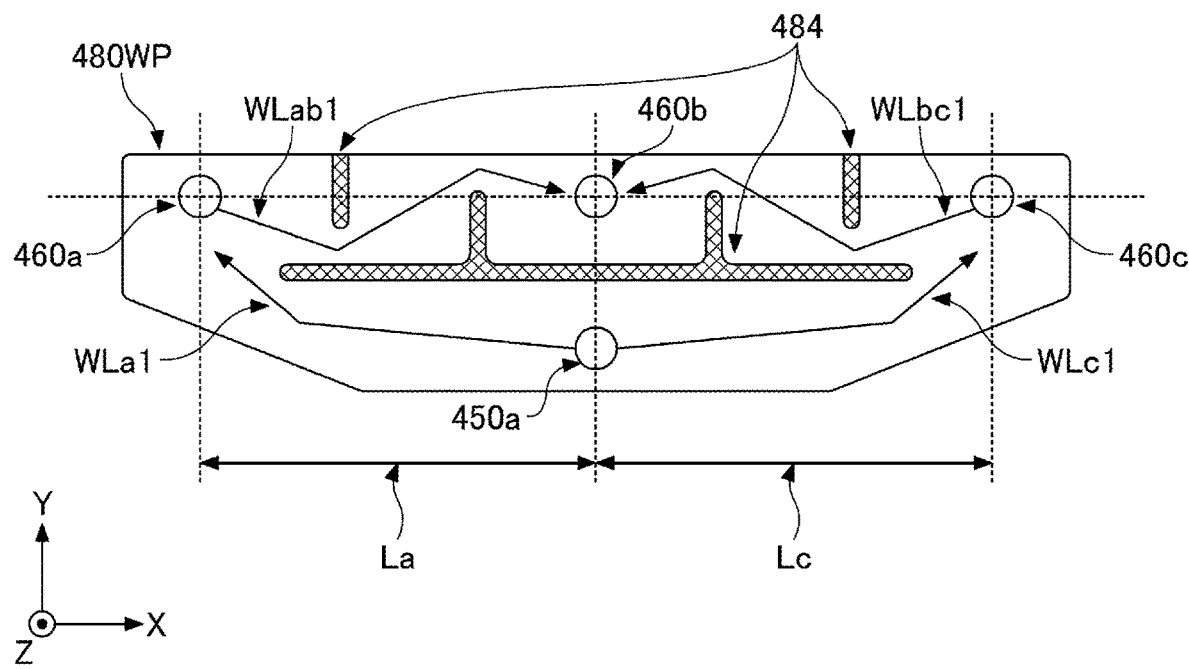
FIG. 19 is a top view illustrating the wiring pattern of a twelfth example of a wiring board.

FIG. 19 is a top view illustrating a wiring pattern 480WP of the eleventh example of the wiring board 400. Specifically, the figure illustrates an example of the wiring pattern 480WP of the wiring 480. FIG. 20 is a top view illustrating a wiring pattern 480WP_C according to the comparative example.

In this example, the circuit diagram of the power conversion apparatus 1 including the wiring board 400 is the same as that of the first example described above, so the illustration is omitted and the explanation is given by referring to FIG. 1.

The wiring pattern 480WP electrically connects the electrode 450a to each of the electrodes 460a to 460c. The wiring pattern 480WP is provided on the soft substrate 420, for example. The wiring pattern 480WP may be provided to span across the soft substrate 420 and the hard substrates 410a to 410c.

As illustrated in FIG. 19, the electrodes 460a to 460c are arranged so that their positions in the Y-axis direction are approximately the same with each other and the distance La between the electrodes 460a and 460b and the distance Lc between the electrodes 460b and 460c are approximately the same.

The electrode 450a is arranged so that the position thereof in the X-axis direction approximately coincides with that of the electrode 460b.

Slits 484 are provided in the wiring pattern 480WP. Accordingly, a portion of the slit 484 is electrically cut off. Therefore, the wiring length between the electrode 450a and each of the electrodes 460a to 460c can be adjusted to bypass the slit 484.

In this example, the slits 484 are provided so that the paths between electrodes 450a and 460b are two paths that pass through the electrodes 460a and 460c, respectively. In this example, the slits 484 are provided so that a wiring length WLa1 between the electrodes 450a and 460a, a wiring length WLc1 between the electrodes 450a and 460c, a wiring length WLab1 between the electrodes 460a and 460b, and a wiring length WLbc1 between the electrodes 460b and 460c are approximately the same.

Therefore, the relationship of the following equation (1) is established between a parasitic inductance component Lpa in the path between the electrodes 450a and 460a and the parasitic inductance component Lpc in the path between electrodes 450a and 460c.

$$Lpa \approx Lpc \quad (1)$$

Further, the two paths between the electrodes 450a and 460b, i.e., the path via the electrode 460a and the path via the electrode 460c, have approximately the same length, and the wiring length thereof is twice as long as the path between the electrodes 450a and 460a. Therefore, the parasitic inductance component Lpb in the path between the electrodes 450a and 460b satisfy the relationship of the following equation (2).

$$Lpb \approx 2 \cdot Lpa/2 \cdot Lpa = Lpa \quad (2)$$

Therefore, as can be seen from equations (1) and (2), in this example, by providing the slit 484, the inductance components of the paths between the electrode 450a and each of the electrodes 460a to 460c can be approximately equalized.

Figure 20:
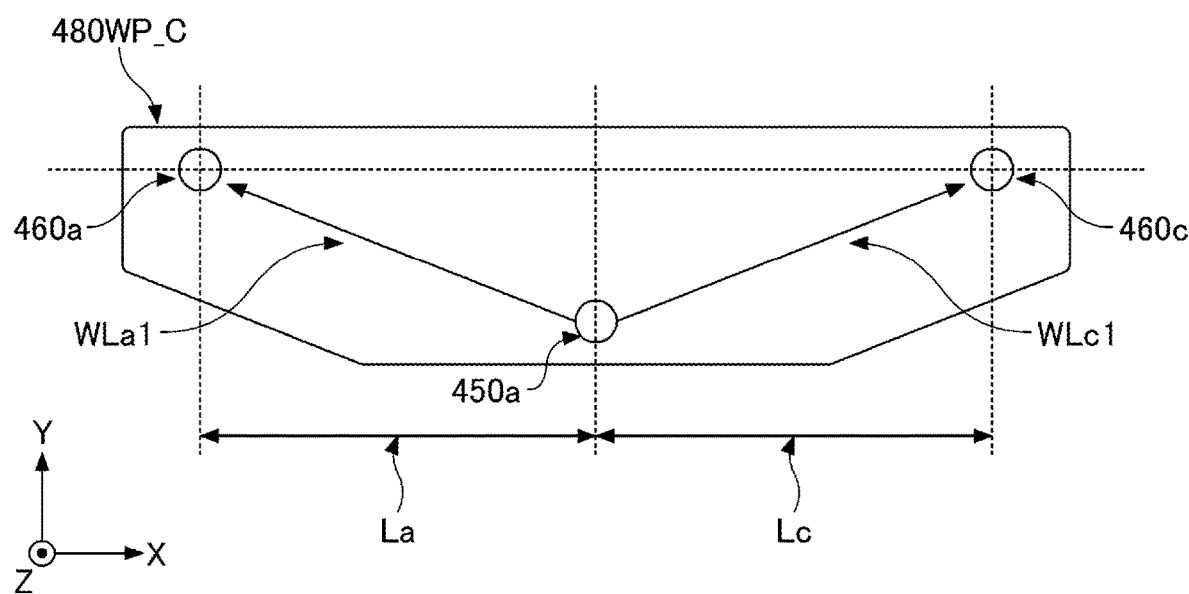
FIG. 20 is a top view illustrating a wiring pattern according to a comparative example.

For example, when the semiconductor module 100b is omitted and the wiring board 400 drives two of the semiconductor modules 100a and 100c, the wiring lengths WLa1 and WLc1 can be matched to be approximately the same relatively easily as illustrated in FIG. 20. However, when there are three or more semiconductor modules driven by the wiring board 400, and an attempt is made to match the wiring lengths only by the geometric arrangement of the electrodes 460a to 460c, this may result in an increase in the mounting area of the wiring pattern 480WP or an increase in unnecessary wiring lengths.

In contrast, in the present example, the slit 484 is provided in the wiring pattern 480WP of the wiring 480 so that the inductance components of the paths between the electrode 450a and each of the electrodes 460a to 460c are approximately the same. Thus, an increase in parasitic inductance components due to the wiring 480 can be prevented while an inadvertent increase in the mounting area and wiring length of the wiring 480 can be prevented.

Other Examples of Wiring Board

The above first to eleventh examples of the wiring board may be combined as appropriate.

For example, the configuration of the wirings 480 and 490 on the hard substrates 430a to 430c of the third example described above may be applied to the hard substrates 410a to 410c of the first, eleventh, and twelfth examples described above.

Further, for example, the arrangement structure of the wirings 480 and 490 in the soft substrate 420 of the fourth and fifth examples described above may be applied to the soft substrates 440a and 440b of the second, third, and sixth to tenth examples described above.

Further, for example, the arrangement structure of the wirings 480 and 490 in the soft substrate 420 of the fifth example described above may be applied to the hard substrates 410a to 410c or the hard substrates 430a to 430c of the first, second, fourth, sixth to twelfth examples and the variations thereof described above.

Further, for example, the common-mode choke coils 495a to 495c of the sixth example described above may be applied to the wirings 480 and 490 of the first, eleventh, and twelfth examples and the variations thereof described above. The same may be applied to the magnetic cores 496a to 496c of the seventh example described above, the resistors 498a to 498c of the ninth example described above, and the resistors 499a to 499c of the tenth example described above.

Further, for example, the magnetic cores 497a and 497b of the eighth example described above may be applied to the soft substrates 420 of the first, eleventh, and twelfth examples and the variations thereof described above.

Further, for example, the aforementioned the ninth example or the variations thereof and the aforementioned tenth example or the variations thereof may be combined. That is, both resistors 498a to 498c and resistors 499a to 499c may be provided on the wiring board 400.

Further, for example, the structures of the electrode 450 and the electric circuit 500 in the eleventh example described above may be applied to the second to tenth and twelfth examples and the variations thereof described above.

For example, the slit 484 of the wiring pattern 480WP of the twelfth example may be applied to the wiring pattern of the wiring 480 of the second to eleventh examples and the variations thereof.

The first to eleventh examples of the above wiring boards and the variations thereof may be modified or changed as appropriate.

For example, in the first to eleventh examples and the variations thereof above, the number of semiconductor switch elements SW (corresponding semiconductor modules) connected in parallel that are the driving targets of the driving circuit board 300 and the wiring board 400, may be two or four or more. In this case, by adopting the same configuration and structure as those of the first to eleventh examples described above and the variations thereof, the same function and effect can be achieved.

For example, in the above twelfth example and the variations thereof, the number of semiconductor switch elements SW (corresponding semiconductor modules) connected in parallel that are the driving targets of the driving circuit board 300 and the wiring board 400 may be four or more. In this case, by adopting the same configuration and structure (the slit 484) as in the twelfth example described above and the variations thereof, the same function and effect can be achieved.

Further, for example, in the above third example and the variations thereof, the number of wiring layers to be stacked on the hard substrates 410a to 410c or the hard substrates 430a to 430c may be three or five or more. In this case, by adopting the same configuration and structure (the stacked structure of the wirings 480 and 490) as in the above third example and the variations thereof, the same operation and effect are achieved.

Further, for example, in the above third example and the variations thereof, instead of the connection part 491, other electrical connection methods related to the wiring 490 of each wiring layer of the hard substrates 430a to 430c and the soft substrates 440a and 440b may be used, in order to electromagnetically shield the wiring 480. For example, the same effect can be obtained by adopting an electrical connection method such as plating the ends of the soft substrates 440a and 440b and the hard substrates 430a to 430c and connecting to the wiring 490 of each wiring layer and the like.

Further, for example, in the above fourth example and the variations thereof, instead of the connection parts 492a to 492c, other electrical connection methods related to the wiring 490 of each wiring layer of the hard substrate 410a to 410c or the soft substrate 420 may be used, in order to electromagnetically shield the wiring 480. For example, by adopting an electrical connection method such as plating the ends of the soft substrate 420 and the hard substrates 410a to 410c and connecting to the wiring 490 of each wiring layer and the like, the same effect can be obtained.

Further, for example, in the fourth and fifth examples and the variations thereof above, the number of wiring layers to be stacked in the soft substrate 420 or the soft substrates 440a and 440b may be three or five or more. In this case, by adopting the same configuration and structure (a stacked structure of the wirings 480 and 490) as in the fourth example above and the variations thereof, the same function and effect are achieved.

Further, for example, in the above eleventh example and the variations thereof, instead of a coaxial structure, the electric circuit 500 may have a structure of a soft substrate and wiring corresponding to the electric circuits 500a and 500b on the soft substrate. In this case, the wiring of the soft substrate corresponding to the electric circuits 500a and 500b may have the same arrangement structure as the wirings 480 and 490 in the soft substrate 420 of the above third example. Accordingly, the same function and effect as the case of a coaxial structure are achieved.

Further, for example, in the first to twelfth examples and variations thereof, the wiring board 400 may be configured to drive multiple sets of multiple semiconductor modules (the semiconductor switch elements SW) connected in parallel. For example, this is suitable when a 2-in-1 package semiconductor module including two semiconductor switch elements SW corresponding to the upper and lower arms is adopted. In this case, multiple sets of the electrodes 460a to 460c, the electrodes 470a to 470c, and the wirings 480 and 490 for driving a specific single set of multiple semiconductor modules are mounted on the hard or soft substrate of the wiring board 400.

[Functions]

Next, the functions of the wiring board 400 according to the present embodiment will be described.

In the present embodiment, the wiring board 400 includes a pair of hard substrates (for example, the hard substrates 410a to 410c), a soft substrate (for example, the soft substrate 420), a first electrode (for example, the electrodes 460a to 460c), a second electrode (for example, the electrodes 470a to 470c), a first wiring (for example, the wiring 480), and a second wiring (for example, the wiring 490). Specifically, a pair of hard substrates is provided for each of a plurality of semiconductor elements (e.g., semiconductor switch elements SW) connected in parallel. Further, the soft substrate is provided so that at least part thereof is sandwiched between all the pairs of hard substrates. The first electrode connects the control terminal of the semiconductor element to the hard or soft substrate. The second electrode connects the reference potential terminal of the semiconductor element to the hard or soft substrate. Further, at least a part of the first wiring is provided on the soft substrate, and the first electrodes for each of the multiple semiconductor elements are connected in parallel. The second wiring, at least partially provided on the soft substrate, connects in parallel the second electrodes for each of the multiple semiconductor elements.

Further, in the present embodiment, the wiring board 400 includes a hard substrate (for example, the hard substrates 430*a* to 430*c*), a soft substrate (for example, the soft substrates 440*a* and 440*b*), a first electrode (for example, the electrodes 460*a* to 460*c*), a second electrode (for example, the electrodes 470*a* to 470*c*), a first wiring (for example, the wiring 480), and a second wiring (for example, the wiring 490). Specifically, the hard substrate is provided for each of the multiple semiconductor elements (for example, the semiconductor switch element SW) connected in parallel. Further, the soft substrate connects between the hard substrates. The first electrode connects the control terminal of the semiconductor element to the hard substrate. The second electrode connects the reference potential terminal of the semiconductor element to the hard substrate. The first wiring is provided on the hard and soft substrates, and connects the first electrodes for each of the multiple semiconductor elements in parallel. The second wiring is provided on the hard and soft substrates, and connects the second electrodes for each of the multiple semiconductor elements in parallel. Further, the hard substrates for each of the multiple semiconductor elements are all connected by the soft substrate.

Thus, the wiring length between the driving circuit and the control terminal for each semiconductor element can be adjusted by the wiring pattern in the hard and soft substrates. Therefore, the degree of freedom of the wiring pattern can prevent an increase in the wiring length when matching the wiring length between the driving circuit and the control terminal for each semiconductor element. As a result, the performance of the semiconductor element can be brought to a desired level and the occurrence of the gate oscillation phenomenon can be reduced. Further, connectors are not used for the interconnection of the hard substrates, and, therefore, the occurrence of connection failure problems can be reduced and the height of the wiring board 400 can be reduced. Therefore, the wiring board 400 with higher reliability and operation stability can be implemented. Moreover, a manufacturing process for fitting the connector is not required, and labor saving in assembly work, improvement in manufacturing efficiency, and reduction in manufacturing cost can be achieved.

Further, in the present embodiment, the hard substrate may have three or more wiring layers. The first wiring may be provided in the inner layer among the three or more wiring layers in the hard substrate. The second wiring may be provided on both of the outer layers among the three or more wiring layers in the hard substrate, and may also be provided on the inner layer so as to sandwich the first wiring therebetween.

This allows the first wiring to be electromagnetically shielded by the second wiring, thereby preventing (canceling) the parasitic inductance component of the second wiring of the hard substrate. Therefore, it is possible to prevent the gate oscillation phenomenon caused by the parasitic components of the first and second wirings and the imbalance of the current flowing to the semiconductor element, and to implement the wiring board 400 with higher reliability and operation stability.

Further, in the present embodiment, in the wiring board 400, the soft substrate may have three or more wiring layers. The first wiring may be provided in the inner layer among three or more wiring layers in the soft substrate. The second wiring may be provided on both of the outer layers among the three or more wiring layers in the soft substrate, and may also be provided on the inner layer so as to sandwich the first wiring therebetween.

This allows the first wiring to be electromagnetically shielded by the second wiring, thereby preventing (canceling) the parasitic inductance component of the second wiring of the soft substrate. Therefore, it is possible to prevent the gate oscillation phenomenon caused by the parasitic components of the first and second wirings and the imbalance of the current flowing through the semiconductor switch element SW to implement the wiring board 400 with higher reliability and operation stability.

Further, in the present embodiment, the first wiring and the second wiring may be alternately stacked on at least one of the hard substrate or the soft substrate.

Thus, part of the parasitic inductance components of the first and second wirings can be canceled. Therefore, the inductance per unit wiring length of the first and second wirings can be reduced. Therefore, it is possible to prevent the gate oscillation phenomenon caused by the parasitic components of the first and second wirings and the imbalance of the current flowing through the semiconductor switch element SW to implement the wiring board 400 with higher reliability and operation stability.

Further, in the present embodiment, the wiring board 400 may be provided with a common-mode choke coil (for example, the common-mode choke coils 495*a* to 495*c*) including a primary-side coil provided in the first wiring and a secondary-side coil provided in the second wiring.

Thus, by preventing the common-mode current between semiconductor elements, the cross current (circulating current) in the first and second wirings, which is caused by variations in the characteristics of each semiconductor element, can be reduced. Therefore, it is possible to prevent the gate oscillation phenomenon, the current imbalance of each semiconductor element, etc., while mitigating the degradation of the switching performance of the semiconductor element. Therefore, the wiring board 400 with higher reliability and operation stability can be implemented.

Further, in the present embodiment, the wiring board 400 may be provided with a magnetic core (for example, the magnetic cores 496*a* to 496*c* and the magnetic cores 497*a*, 497*b*) for the common mode choke surrounding the first and second wirings.

Accordingly, as in the case of the common-mode choke coil, the common-mode current can be prevented, and as a result, the cross current (circulation current) of the first and second wirings, which is caused by variations in the characteristics of each semiconductor element, can be reduced. Therefore, it is possible to prevent the gate oscillation phenomenon, the current imbalance of each semiconductor element, etc., while mitigating the degradation of the switching performance of the semiconductor element. Therefore, the wiring board 400 with higher reliability and operation stability can be implemented.

Further, in the present embodiment, in the wiring board 400, the magnetic core (for example, the magnetic cores 497*a*, 497*b*) have cutouts and may be fixed to the hard substrate by the cutouts.

Thus, the magnetic core can be efficiently fixed to the wiring board 400 with a simple structure.

Further, in the present embodiment, the wiring board 400 may have a first resistor (for example, the resistors 498a to 498c) provided in the first wiring.

This can prevent the current imbalance caused by variations and the like in the characteristics of each semiconductor element. When the current imbalance is at a negligible level, the cross current (circulating current) between the semiconductor elements can be prevented.

In the present embodiment, the wiring board 400 may also have a second resistor (for example, the resistors 499a to 499c) provided on the second wiring.

This can prevent the current imbalance caused by variations and the like in the characteristics of each semiconductor element. When the current imbalance is at a negligible level, the cross current (circulating current) between the semiconductor elements can be prevented.

Further, in the present embodiment, the wiring board 400 may be provided with a third electrode (for example, the electrode 450a) connecting the first wiring to the driving circuit for driving the multiple semiconductor elements. Also, the third electrode may have a coaxial structure.

Thus, the parasitic inductance component of the third electrode in the wiring path from the driving circuit to the multiple semiconductor elements can be reduced. Therefore, the gate oscillation phenomenon caused by the parasitic component and the imbalance of the current flowing to the semiconductor element can be prevented, and the wiring board 400 with higher reliability and operation stability can be implemented.

Further, in the present embodiment, in the wiring board 400, the third electrode and the driving circuit may be connected by an electric circuit (for example, the electrical circuit 500a) having a coaxial structure.

This reduces the parasitic inductance component of the electrical circuit between the third electrode and the driving circuit in the wiring path from the driving circuit to the multiple semiconductor elements. Therefore, the gate oscillation phenomenon caused by the parasitic component and the imbalance of the current flowing to the semiconductor element can be prevented, and the wiring board 400 with higher reliability and operation stability can be implemented.

Further, in the present embodiment, the wiring board 400 may be provided with a third electrode (For example, the electrode 450a) connecting the first wiring to the driving circuit for driving the multiple semiconductor elements. Also, a slit (for example, the slit 484) may be provided in the wiring pattern (for example, the wiring pattern 480WP) of the first wiring so that the parasitic impedance is equal between the paths of the parallel connection of the third electrode and the first electrode for each of the multiple semiconductor elements.

Thus, an increase in parasitic inductance components due to the wiring 480 can be prevented while an inadvertent increase in the mounting area and wiring length of the wiring 480 can be prevented.

In the present embodiment, in the wiring board 400, the first electrode, the second electrode, the first wiring, and the second wiring may be mounted for each of a plurality of sets, each set of the plurality of sets including the plurality of semiconductor elements.

Thus, for example, when a 2 in 1 package semiconductor module including two semiconductor elements of upper and lower arms is utilized, the wiring board 400 can drive multiple sets of multiple semiconductor elements connected in parallel.

While the embodiment of the present disclosure has been described in detail above, the present disclosure is not limited to the specific embodiment described above, and various modifications and variations can be made within the scope of the subject matter of the present invention as claimed.

What is claimed is:

1. A wiring board comprising:
    a pair of hard substrates provided for each of a plurality of semiconductor elements connected in parallel;
    a soft substrate provided so as to be at least partially sandwiched between all of the pairs of hard substrates;
    a first electrode configured to connect a control terminal of the semiconductor element and the hard substrate or the soft substrate;
    a second electrode configured to connect a reference potential terminal of the semiconductor element and the hard substrate or the soft substrate;
    a first wiring configured to connect in parallel the first electrodes of each of the plurality of semiconductor elements, at least part of the first wiring being provided on the soft substrate; and
    a second wiring configured to connect in parallel the second electrodes of each of the plurality of semiconductor elements, at least part of the second wiring being provided on the soft substrate.

2. The wiring board according to claim 1, wherein
    the hard substrate includes three or more wiring layers,
    the first wiring is provided on an inner layer among the three or more wiring layers in the hard substrate, and
    the second wiring is provided on both outer layers among the three or more wiring layers and also on the inner layer so as to sandwich the first wiring in the hard substrate.

3. The wiring board according to claim 1, wherein
    the soft substrate includes three or more wiring layers,
    the first wiring is provided on an inner layer among the three or more wiring layers in the soft substrate, and
    the second wiring is provided on both outer layers among the three or more wiring layers and also on the inner layer so as to sandwich the first wiring in the soft substrate.

4. The wiring board according to claim 1, wherein in at least one of the hard substrate or the soft substrate, the first wiring and the second wiring are alternately stacked.

5. The wiring board according to claim 1, further comprising:
    a common-mode choke coil including a primary-side coil provided on the first wiring and a secondary-side coil provided on the secondary wiring.

6. The wiring board according to claim 1, further comprising:
    a magnetic core for common-mode choke surrounding the first wiring and the second wiring.

7. The wiring board according to claim 6, wherein the magnetic core includes a cutout, and the magnetic core is fixed to the hard substrate by the cutout.

8. The wiring board according to claim 1, further comprising:
    a first resistor provided on the first wiring.

9. The wiring board according to claim 1, further comprising:
    a second resistor provided on the second wiring.

10. The wiring board according to claim 1, further comprising:
a third electrode configured to connect a driving circuit and the first wiring, the driving circuit being configured to drive the plurality of semiconductor elements, wherein
the third electrode has a coaxial structure.

11. The wiring board according to claim 10, wherein the third electrode and the driving circuit are connected by an electric circuit having a coaxial structure.

12. The wiring board according to claim 1, further comprising:
a third electrode configured to connect a driving circuit and the first wiring, the driving circuit being configured to drive the plurality of semiconductor elements, wherein
a slit is provided in a wiring pattern of the first wiring such that a parasitic impedance is equal between paths that connect in parallel the third electrode and the first electrode of each of the plurality of semiconductor elements.

13. The wiring board according to claim 1 wherein the first electrode, the second electrode, the first wiring, and the second wiring are mounted for each of a plurality of sets, each set of the plurality of sets including the plurality of semiconductor elements.

14. A power conversion apparatus comprising:
the wiring board according to claim 1; and
the plurality of semiconductor elements.

15. A wiring board comprising:
a hard substrate provided for each of a plurality of semiconductor elements connected in parallel;
a soft substrate configured to connect the hard substrates to each other;
a first electrode configured to connect a control terminal of the semiconductor element and the hard substrate;
a second electrode configured to connect a reference potential terminal of the semiconductor element and the hard substrate;
a first wiring configured to connect in parallel the first electrodes of each of the plurality of semiconductor elements, the first wiring being provided on the hard substrate and the soft substrate; and
a second wiring configured to connect in parallel the second electrodes of each of the plurality of semiconductor elements, the second wiring being provided on the hard substrate and the soft substrate, wherein
all of the hard substrates of each of the plurality of semiconductor elements are connected by the soft substrate.

* * * * *